(12) United States Patent
Meloni

(10) Patent No.: US 10,923,324 B2
(45) Date of Patent: *Feb. 16, 2021

(54) MICROWAVE PLASMA SOURCE

(71) Applicant: Verity Instruments, Inc., Carrollton, TX (US)

(72) Inventor: Mark A. Meloni, Carrollton, TX (US)

(73) Assignee: Verity Instruments, Inc., Carrollton, TX (US)

( * ) Notice: Subject to any disclaimer, the term of this patent is extended or adjusted under 35 U.S.C. 154(b) by 146 days.

This patent is subject to a terminal disclaimer.

(21) Appl. No.: 16/254,177

(22) Filed: Jan. 22, 2019

(65) Prior Publication Data

US 2019/0157045 A1 May 23, 2019

Related U.S. Application Data

(63) Continuation-in-part of application No. 16/022,389, filed on Jun. 28, 2018, now Pat. No. 10,679,832.

(Continued)

(51) Int. Cl.
*H01J 37/32* (2006.01)
*H05H 1/46* (2006.01)
(Continued)

(52) U.S. Cl.
CPC .. *H01J 37/32266* (2013.01); *H01J 37/32201* (2013.01); *H01J 37/32238* (2013.01);
(Continued)

(58) Field of Classification Search
None
See application file for complete search history.

(56) References Cited

U.S. PATENT DOCUMENTS

| 4,906,900 A | 3/1990 | Asmussen |
| 5,885,402 A | 3/1999 | Esquibel |

(Continued)

FOREIGN PATENT DOCUMENTS

| CN | 103258706 A | 8/2013 |
| JP | 2-295052 A | 12/1990 |

(Continued)

OTHER PUBLICATIONS

Moisan, et al.; "Plasma sources based on the propagation of electromagnetic surface waves"; Review Article; J. Phys. D: Appl. Phys. 24; Departement de Physique, Universite de Montreal; Jul. 11, 1990; 24 pgs.

(Continued)

*Primary Examiner* — Robert K Carpenter

(57) ABSTRACT

The disclosure provides a plasma source and an excitation system for excitation of a plasma, and an optical monitoring system. In one embodiment the plasma source includes: (1) a coaxial resonant cavity body having an inner length, and including a first end, a second end, an inner electrode and an outer electrode, (2) a radio frequency signal interface electrically coupled to the inner and outer electrodes at a fixed position along the inner length and configured to provide a radio frequency signal to the coaxial resonant cavity body, (3) a window positioned at the first end of the coaxial resonant cavity body, and (4) a mounting flange positioned proximate the window at the first end of the coaxial resonant cavity body and defining a plasma cavity, wherein the window forms one side of the plasma cavity and isolates the coaxial resonant cavity body from plasma in the plasma cavity.

26 Claims, 14 Drawing Sheets

Related U.S. Application Data

(60) Provisional application No. 62/530,589, filed on Jul. 10, 2017.

(51) Int. Cl.
  H05H 1/00 (2006.01)
  H01L 21/3065 (2006.01)

(52) U.S. Cl.
  CPC ..... H01J 37/32256 (2013.01); H05H 1/0037 (2013.01); H05H 1/46 (2013.01); H01L 21/3065 (2013.01); H05H 2001/463 (2013.01); H05H 2001/4607 (2013.01)

(56) References Cited

U.S. PATENT DOCUMENTS

| | | | |
|---|---|---|---|
| 10,679,832 B2 * | 6/2020 | Meloni | H01L 22/26 |
| 2002/0135761 A1 | 9/2002 | Powell et al. | |
| 2006/0144520 A1 | 7/2006 | Fink | |
| 2012/0211466 A1 | 8/2012 | Choi | |
| 2013/0115781 A1 | 5/2013 | Matsumoto et al. | |
| 2015/0053346 A1 | 2/2015 | Matsumoto et al. | |
| 2016/0284516 A1 | 9/2016 | Ikeda et al. | |
| 2017/0303380 A1 | 10/2017 | Zindler et al. | |

FOREIGN PATENT DOCUMENTS

| | | |
|---|---|---|
| JP | 9-115694 A | 5/1997 |
| JP | 2001-148372 A | 5/2001 |
| JP | 2004-266268 A | 9/2004 |
| JP | 2013-77441 A | 4/2013 |
| JP | 2013-118398 A | 6/2013 |
| KR | 10-1997-0028874 | 6/1997 |
| KR | 1020040010898 A | 2/2004 |
| KR | 1020080101968 A | 11/2008 |
| KR | 20110020702 A | 3/2011 |
| KR | 1020110020723 A | 3/2011 |
| KR | 1020120081246 A | 7/2012 |
| TW | 201123999 A | 7/2011 |
| TW | 201346973 A | 11/2013 |
| TW | I452627 B | 9/2014 |
| TW | I452946 B | 9/2014 |
| TW | 201705823 A | 2/2017 |
| TW | I575553 B | 3/2017 |

OTHER PUBLICATIONS

Kogelschatz; "Fundamentals and Applications of Dielectric-Barrier Discharges"; ABB Corporate Research Ltd.; May 24, 2000; 7 pgs.
Bilgic, et al.; "Design and modelling of a modified 2.45 GHz coaxial plasma torch for atomic spectrometry"; Technical note; Spectrochimica Acta Part B; Elsevier; Oct. 2, 1997; 5 pgs.

* cited by examiner

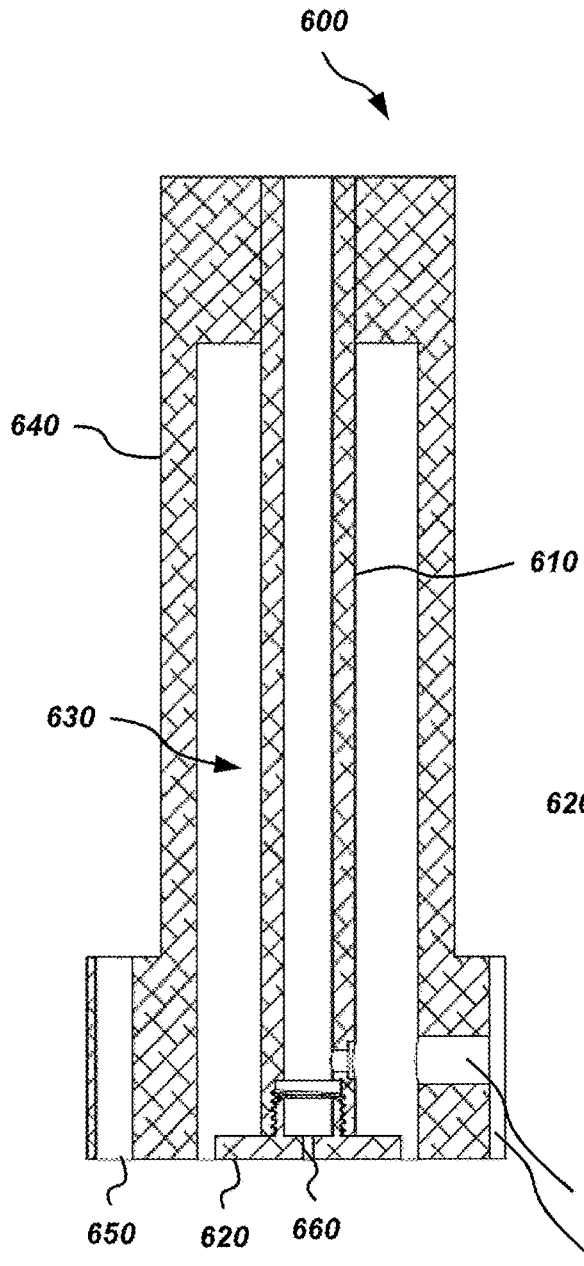
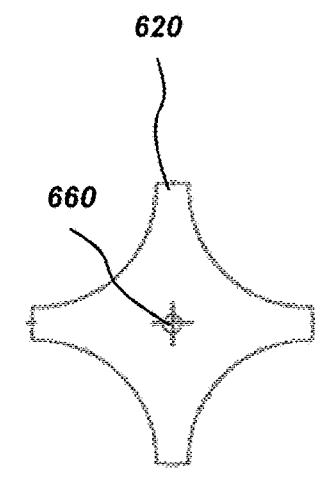
FIG. 6C
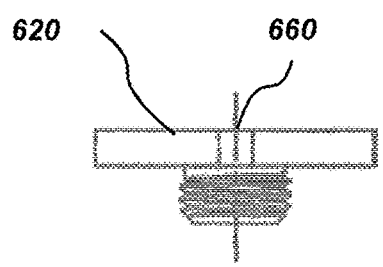
FIG. 6B
FIG. 6A
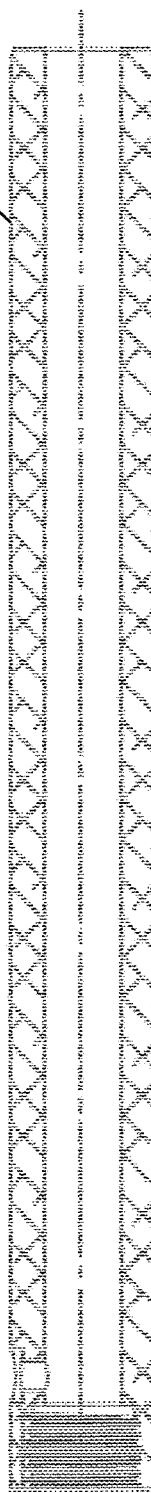
FIG. 6D

MICROWAVE PLASMA SOURCE

CROSS-REFERENCE TO RELATED APPLICATIONS

This application is a continuation-in-part of U.S. patent application Ser. No. 16/022,389 filed by Mark A. Meloni on Jun. 28, 2018 entitled "MICROWAVE PLASMA SOURCE," which, in turn, claimed the benefit of U.S. Provisional Application Ser. No. 62/530,589, filed by Mark A. Meloni on Jul. 10, 2017, entitled "MICROWAVE PLASMA SOURCE," both of which are commonly assigned with this application and incorporated herein by reference in their entirety.

TECHNICAL FIELD

This application is directed, in general, to monitoring semiconductor processes and, more specifically, to optical monitoring of processes via microwave excitation of process gasses and observation of resultant optical signals.

BACKGROUND

Selectively removing or depositing materials from a semiconductor wafer to form integrated circuit structures thereon is well known in the art of semiconductor processing. Removal of material from a semiconductor wafer is commonly accomplished by employing an etching process such as reactive ion etching or plasma etching. Deposition of material onto a wafer may involve processes such as chemical and physical vapor deposition and molecular beam epitaxy. Other removal and deposition processes are also known. Such processes are precisely controlled and are performed in regulated process chambers.

Because exact amounts of material must be deposited onto or removed from the semiconductor wafer, processes must be continually and accurately monitored to precisely determine the state of a particular process and the related wafer. Optical monitoring of the process is one very useful tool for determining the state of an ongoing process. For instance, excited gasses within the interior of the process chamber may be optically monitored and reviewed for certain known compounds by spectrally analyzing predetermined wavelengths of the light emitted from a plasma formed from the excited gasses. Conventional optical monitoring methods include optical emission spectroscopy (OES), absorption spectroscopy, and reflectometry.

One customary method to monitor the optical emissions (light) from within a semiconductor plasma process chamber is to use an optical monitoring system which consists of an array-based optical spectrometer and an optical coupling system to transfer the light from the plasma in the interior of the chamber to the spectrometer. The optical emission spectrum is typically recorded as a series of light intensity measurements and resampled repeatedly at specific time intervals. The series of light intensity measurements can be recorded in a set of narrow spectral bands by photodiode detectors having band pass filters, or over a broad spectrum by a spectrometer.

SUMMARY

In one aspect the disclosure provides a plasma source for excitation of a plasma from one or more gasses and monitoring of optical emissions therefrom. In one embodiment the plasma source includes: (1) a coaxial resonant cavity body having an inner length, and including a first end, a second end, an inner electrode and an outer electrode, (2) a radio frequency signal interface electrically coupled to the inner and outer electrodes at a fixed position along the inner length and configured to provide a radio frequency signal to the coaxial resonant cavity body, (3) a window positioned at the first end of the coaxial resonant cavity body, and (4) a mounting flange positioned proximate the window at the first end of the coaxial resonant cavity body and defining a plasma cavity, wherein the window forms one side of the plasma cavity and isolates the coaxial resonant cavity body from plasma in the plasma cavity.

In another aspect, the disclosure provides an excitation system for excitation of a plasma. In one embodiment, the excitation system includes: (1) a coaxial resonant cavity body having an inner length, and including a first end, a second end, an inner electrode and an outer electrode, (2) a radio frequency signal interface electrically coupled to the inner and outer electrodes at a fixed position along the inner length and configured to provide a radio frequency signal to the coaxial resonant cavity body, and (3) a source controller configured to provide a radio frequency signal to the radio frequency signal interface.

In yet another aspect, the disclosure provides an optical monitoring system. In one embodiment, the optical monitoring system includes: (1) a plasma source configured to ignite, excite and produce optical emission from a plasma within a plasma cavity in gaseous communication with a process chamber, (2) a source controller configured to provide a radio frequency signal to a radio frequency signal interface of the plasma source to generate an electromagnetic field in the plasma cavity for the ignition and excitation of the plasma, (3) an optical coupling system configured to communicate optical signals observed from the excitation of the plasma, and (4) a spectrometer configured to receive and convert the optical signals to electrical signals.

BRIEF DESCRIPTION OF THE DRAWINGS

The disclosure may be understood by reference to the following detailed description taken in conjunction with the drawings briefly described below.

FIGS. 6A-6D illustrate different views of a modular inner electrode constructed according to the principles of the disclosure;

DETAILED DESCRIPTION

Measurement of plasma optical emission within a chamber as the plasma reacts with the semiconductor wafer can be difficult in some applications. For example, the amount of plasma optical emission related to the wafer may be limited or non-existent when the process gas within the chamber is excited remotely from the wafer and considerable time is required for the excited reactants to interact with the wafer surface. The amount of plasma optical emission is limited, for example, when resulting in a signal lacking details, having a low signal to noise ratio, or lacking expected data. In these so-called "dark plasma" applications, measurements of the plasma optical emission, even if obtainable, may not provide an accurate characterization of the process acting upon the semiconductor wafer since the plasma optical emission may not contain optical emissions characteristic of the reactions occurring on the wafer surface. Similarly, some semiconductor processes do not utilize plasmas and there are no optical emissions to observe.

It is realized herein that excitation of process gas or gasses proximate to a wafer or in other relevant or convenient locations in or associated with a process chamber is often needed to generate light for optical monitoring of certain known emission lines or broad spectral features emitted from the reactions in the chamber. The disclosure provides a solution for plasma excitation and monitoring of the optical emissions resulting from the excitation. In general, the disclosure provides a plasma source that is designed to receive a radio frequency (RF) signal and provide an electromagnetic (EM) field as an excitation source of the process gas.

The plasma sources include a coaxial resonant cavity body including a cavity having a length denoted herein as an inner length L1 that extends from an open end of the cavity to a shorted end. The open end is located proximate a process end of the coaxial resonant cavity body and the shorted end is located at the opposite end of the coaxial resonant cavity body. An RF signal interface is coupled to the coaxial resonant cavity body at a position along the inner length denoted herein as a coupling point distance L2. The coupling point distance L2 extends from the open end of the coaxial resonant cavity body to the center line of the center conductor of the RF signal interface that extends into the coaxial resonant cavity body.

Figure 4A:
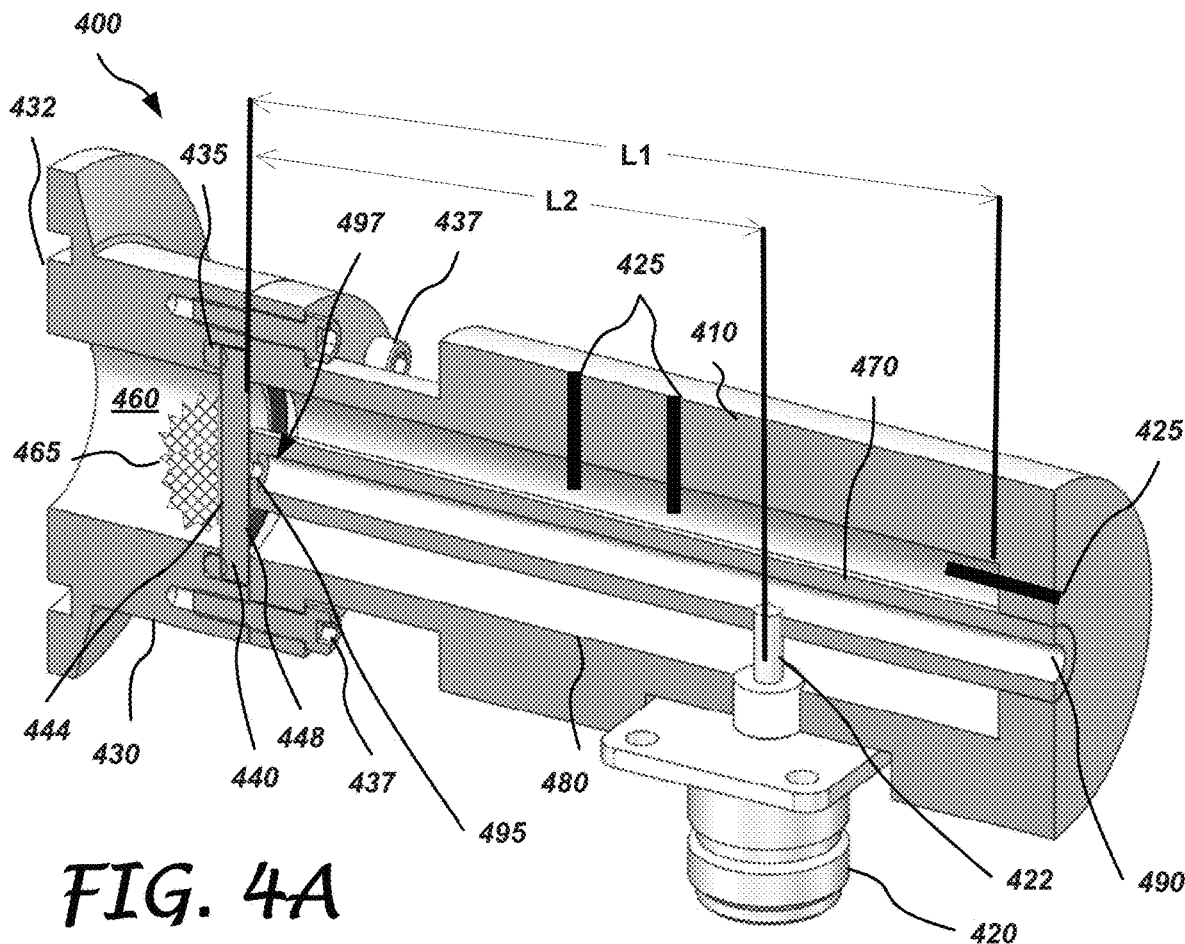
FIG. 4A illustrates a three-dimensional cross-sectional view of an embodiment of a plasma source constructed according to the principles of the disclosure.

The values of the inner length L1 and the coupling point distance L2 are based on maximization of an electromagnetic (EM) field established at or near a process environment surface at the process end using an RF signal received via the RF signal interface. Inner lengths L1 and coupling point distances L2 of the coaxial resonant cavity bodies depend upon the actual frequency of operation and the associated free-space wavelength of the RF waves provided via the RF signal interface. Additional discussion of the inner length L1 and coupling point distance L2 are discussed below, such as with respect to FIG. 4A. FIG. 4A illustrates the dimensions L1 and L2 for an embodiment of a plasma source 400.

Discussions and examples herein refer to plasma-based processes and plasma process chambers but one skilled in the art will understand that the various principles and features of the disclosure may be used with other types of system where excitation of process gas and monitoring of the optical excitations may be performed. In addition to processes directly involving semiconductor wafers, processes such as chamber cleaning may also be optically monitored by application of the plasma sources described herein. The described plasma sources may also be used in non-semiconductor applications where monitoring of gasses is of interest. For example, the plasma sources can be used for emissions monitoring associated with industrial smokestacks, chemical plants, etc.

Figure 1:
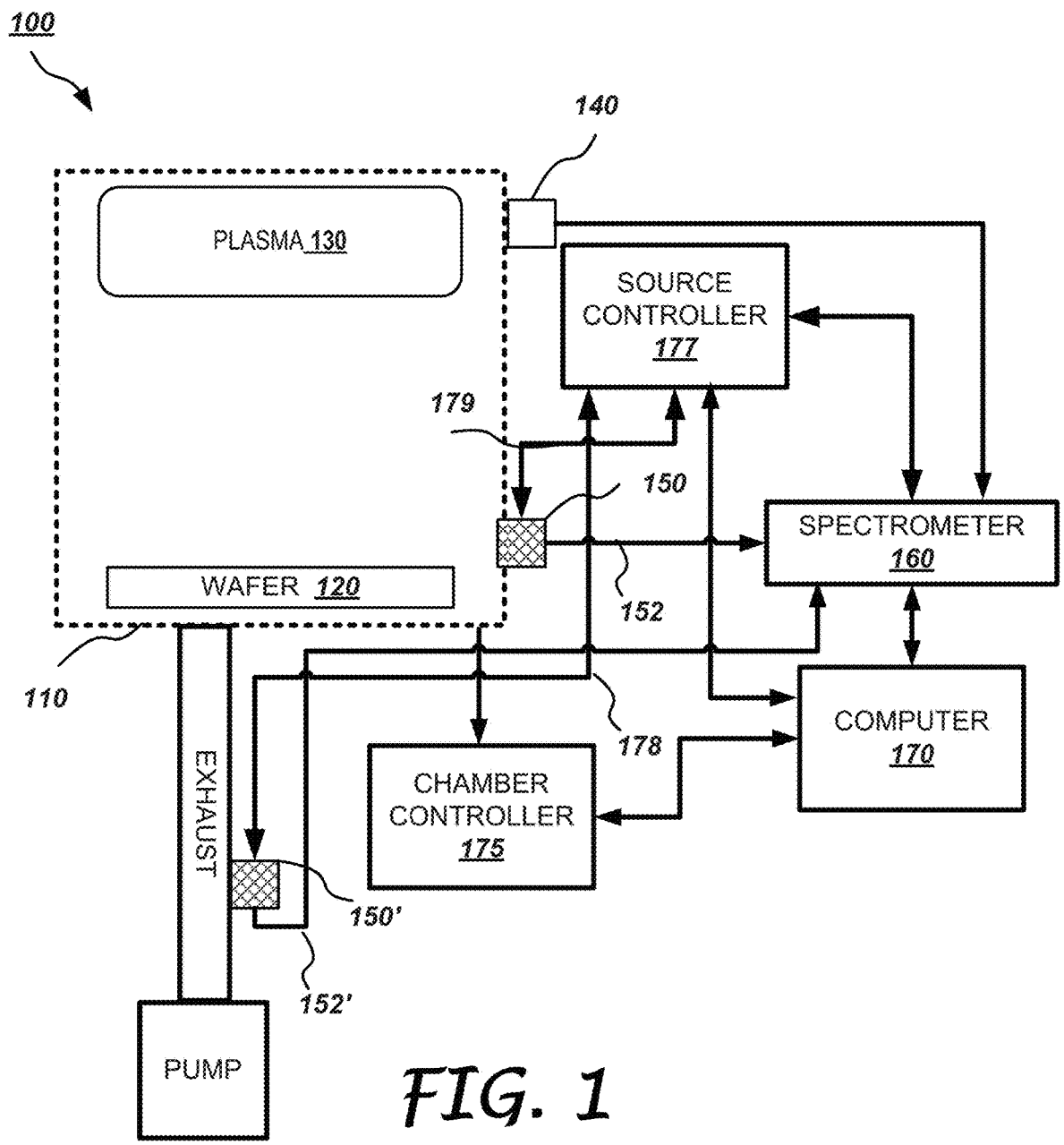
FIG. 1 illustrates a block diagram of an example process control system employing a plasma source for excitation and optical monitoring of a plasma to determine the state of a process within a process tool.

FIG. 1 illustrates a block diagram of an embodiment of a process control system 100 employing a plasma source for excitation and monitoring of a plasma to determine the state of a process within a process tool. In process system 100, process gas within process chamber 110 is excited remotely from wafer 120. By the time that the excited reactants interact with the surface of wafer 120 the amount of optical emission may be limited or non-existent as discussed above. Therefore measurements of the optical emissions from plasma 130 may not provide an accurate characterization of the etching process of semiconductor wafer 120 since the optical emission from plasma 130 may not contain emissions from the reactions occurring on the surface of wafer 120.

Accordingly, process system 100 advantageously employs plasma sources 150 and 150' to provide optical signals for observation. Plasma source 150 is directly attached to process chamber 110 via a suitable port near wafer 120 and plasma source 150' is located on an exhaust line of the system 100. In general, a plasma source disclosed herein may be located at any one or multiple locations which provide interaction with the process gas. The plasma source 150 may include optical elements positioned within plasma source 150 that are or are part of optic cable assembly 152 that directs collected light transmitted through a window of plasma source 150 to spectrometer 160. Similarly, optical cable assembly 152' directs light provided by plasma source 150' to spectrometer 160. Optical cable assemblies 152 and 152' may, for example, be bundles of optical fiber or may include other optical elements such as lens or filters. As illustrated in FIG. 1, multiple plasma sources 150 and 150' can be employed simultaneously in different locations of process system 100 to provide independent monitoring. In such implementations, each plasma source 150 and 150' has a corresponding input port of spectrometer 160 for delivering the produced optical signals for measurement. Although in FIG. 1 a shared spectrometer 160 is shown, independent spectrometers or other light measurement systems, such as photodiode sensors, may be used for each plasma source.

In addition to plasma sources 150 and 150', optical interface 140 which may include a collimator or other optical elements may be oriented to collect optical emissions from plasma 130. As shown in FIG. 1, optical interface 140 directly observes light emitted from plasma 130. However, if plasma 130 provides insufficient optical signals, optical interface 140 may be replaced with a plasma source similar to plasma sources 150 and 150'.

In addition to spectrometer 160 and computer 170, the process system 100 also includes chamber controller 175 and source controller 177. Chamber controller 175, often a type of industrial computer, may be configured to direct operation of the process chamber 110 by receiving monitoring data and control signals from computer 170 or spectrometer 160. Source controller 177 may communicate with chamber controller 175 to receive information such as process settings, gas types, gas pressures, etc., as well as plasma source control parameters of at least RF power level, phase and frequency. The source controller 177 can be or can be similar to the source controller described in association with FIG. 13. Source controller 177 may also be configured to provide an RF signal of a defined power level, phase and frequency to the plasma sources 150 and 150'. Source controller 177 may provide the RF signal via coaxial cables 178 and 179 to the plasma sources 150 and 150' via an RF interface on each source. Source controller 177 may, for example, provide an RF signal having a nominal frequency of 2.45 GHz within the 2.4-2.5 GHz ISM band. Other examples of the RF signal frequencies include: a nominal frequency of 915 MHz within the 902-928 MHz ISM band, a nominal frequency of 5.8 GHz within the 5.725-5.875 GHz ISM band, or a nominal frequency of 24.125 GHz within the 24-24.25 GHz ISM band. Typically, the frequency is constant or narrowly variable in continuous or discrete steps. The amount of RF power supplied may be controlled manually or automatically. Source controller 177 may also vary the RF power for ignition or in response to external commands as described herein. As such, source controller 177 can be coupled to spectrometer 160, computer 170 and/or chamber controller 175 to alter the RF signal power level delivered to plasma sources 150 and 150'. Source controller 177 can also be used to automatically control the amount of power or the center frequency of the RF signal supplied to a coaxial RF resonator of the plasma sources 150 and 150'. Source controller 177 can include the necessary logic circuitry, software, combination of circuitry and software, etc., for controlling the RF signal.

For clarity, not all connections between elements of FIG. 1 are described or enumerated. In general, it should be understood that source controller 177 may interact directly with plasma sources 150 and 150' and directly or indirectly with chamber controller 175, spectrometer 160 and computer 170. For example, spectrometer 160 may send a signal to source controller 177 to either raise or lower an RF signal level to change a measured optical signal level in response to a predetermined value of that signal level. Similarly, since it may be advantageous to continuously sustain the plasma excitation of a plasma source, chamber controller 175 and/or computer 170 may send signals to source controller 177 to set an RF signal level regardless of any optical signals measured by spectrometer 160. This activity may be performed to maintain the temperature of a plasma source for improved stability or accommodate changes during multiple step processes occurring in chamber 110.

The purpose of optical monitoring can vary based upon the location of the plasma source. For example, if the plasma source is located before interaction of the process gas with a wafer, the optical monitoring can be for characterization of appropriate decomposition or existence of certain reactants. If proximate a wafer, the optical monitoring can be for characterization of changes in composition of the process gas resulting from interaction of the process gas and the wafer. If after interaction with a wafer, the optical monitoring can also be for characterization of changes in the process gas composition or for understanding of reaction product formation. Examples of locations before, proximate, and after correspond to the locations of optical interface 140, plasma source 150, and plasma source 150', respectively, as illustrated in FIG. 1.

Figure 2A:
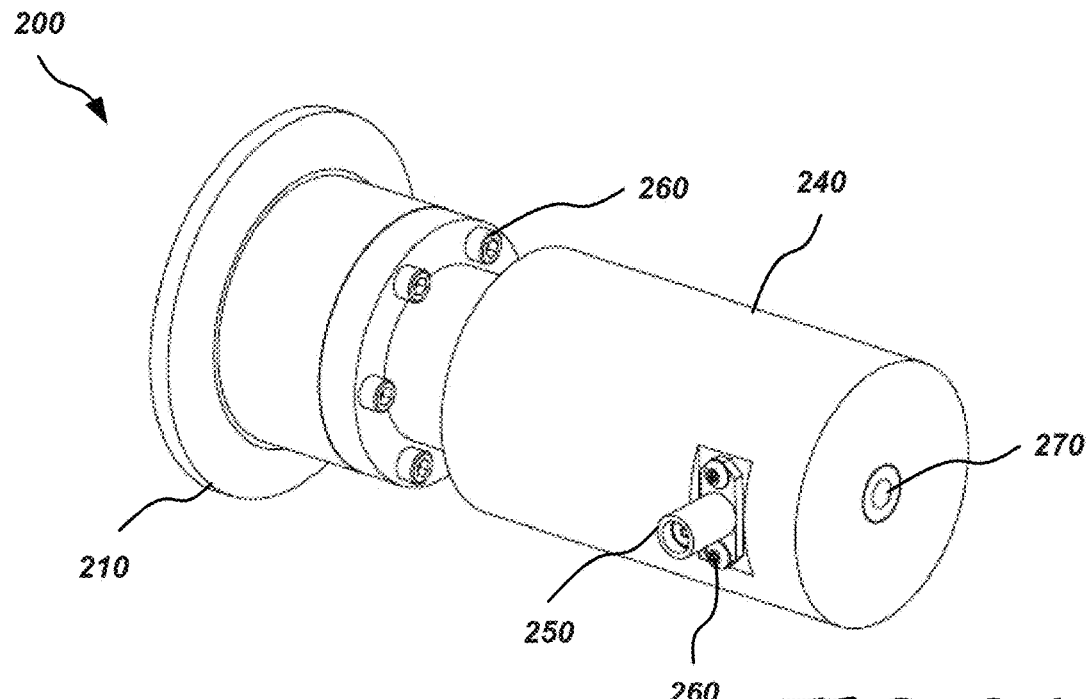
FIG. 2A illustrates a three-dimensional view of an embodiment of a ¾-wave plasma source constructed according to the principles of the disclosure.
Figure 2B:
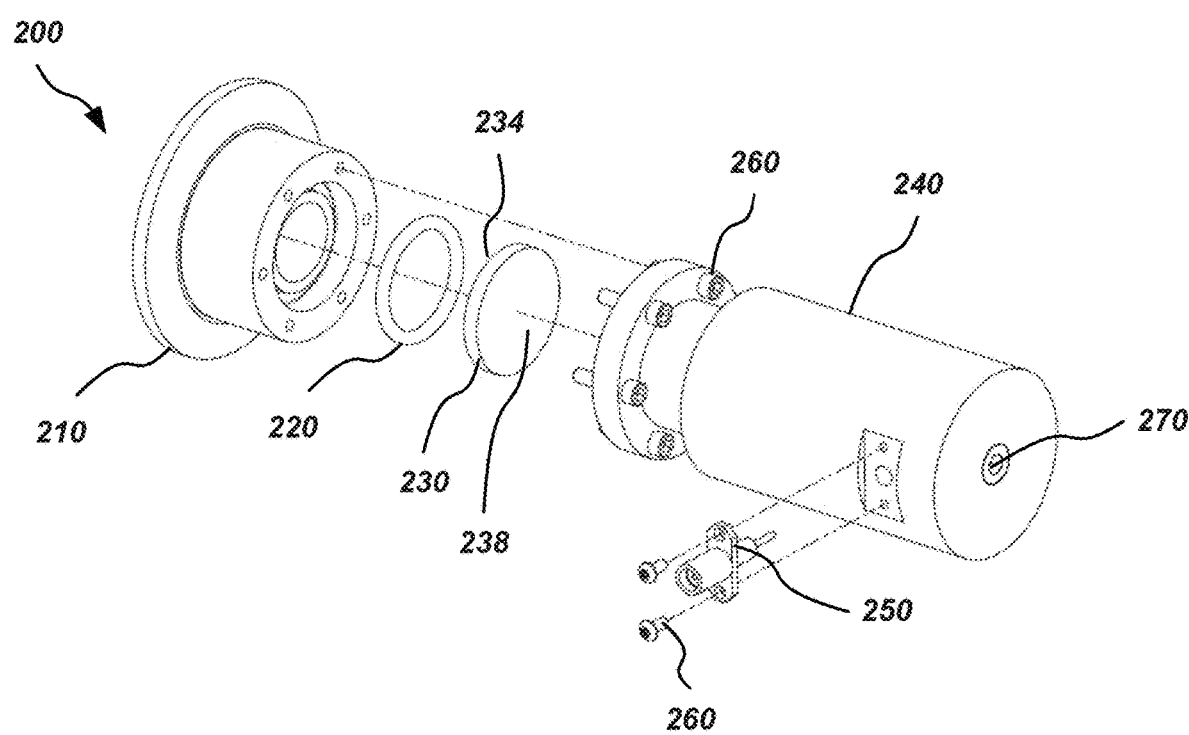
FIG. 2B illustrates an exploded view of the plasma source of FIG. 2A.

FIG. 2A illustrates a three-dimensional view of an embodiment of a ¾-wave plasma source 200 constructed according to the principles of the disclosure. FIG. 2B illustrates a three-dimensional exploded view of plasma source 200 indicating principle components of the plasma source 200 and the ease of disassembly for repair and/or maintenance. The plasma source 200 can be the plasma source 150 and/or 150' of FIG. 1. Plasma source 200 reduces the complexity of the existing technologies and may be conveniently assembled from mounting flange 210, o-ring 220, window 230, coaxial resonant cavity body 240, and RF signal interface 250 joined by mechanical fasteners such as bolts or screws, generally denoted as element 260 in FIGS. 2A and 2B. An optical fiber access 270 is shown at an end of the coaxial resonant cavity body 240.

The optomechanical and RF configuration of plasma source 200 decouples the process volume and the operating conditions of the plasma source 200. Coaxial resonant cavity body 240 of plasma source 200 is separated from the process volume by window 230 and therefore has reduced impacts from process gas species, pressure loadings and other interactions compared to existing designs. The window 230 has a process side 234 and an ambient side 238. In general, the RF resonant conditions of coaxial resonant cavity body 240 are stable regardless of changes in the process volume contacting the surface of the process side 234 of window 230.

Plasma source 200 projects high intensity electromagnetic fields out of coaxial resonant cavity body 240, across window 230, and into any process gasses contained in a plasma cavity within mounting flange 210 that are in gaseous communication with the process chamber. FIG. 4 illustrates a plasma cavity 460 with respect to a mounting flange. One of the benefits of the design of plasma source 200 is the minimized interaction with the process space. For example, most of the components of plasma source 200 are isolated from the process environment, such that only mounting flange 210, o-ring 220, and the window 230 may be in contact with the process space, associated process gasses, and any excited plasma.

The reduction in mechanical and material complexity of plasma source 200 reduces potential contamination, material incompatibility and adverse interaction with the process occurring in the chamber. Mounting flange 210 may be formed from an aluminum alloy as is common for process chambers and internally coated if required. Window 230 is preferably of 1 to 5 mm thick c-axis oriented sapphire which is highly resistant to process gasses and plasma erosion. O-ring 220 may be formed from a perflouroelastomer compound resistant to process gasses and plasma environments. Coaxial resonant cavity body 240 may also be constructed of aluminum alloy or other metals.

Plasma source 200 is operable in a wide pressure range, is suitable for multiple process types, and is operable in various monitoring locations, including process chambers and foreline operations as indicated by plasma sources 150 and 150' of FIG. 1. Although actual pressures may vary, the operational pressure range of plasma source 200 may vary from approximately 0.1 millitorr or less when directly connected to process chambers to greater than 10 torr when attached to a chamber foreline.

To ease placement at various locations, plasma source 200 can advantageously have a compact form factor. For example, ¾-wave plasma source 200 can have the dimensions of approximately 100 mm×35 mm×35 mm (L×W×H) excluding cables and electronics. As shown in FIG. 2A, the plasma source 200 is conveniently designed for mounting to a Klein Flange (KF) interface, such as a conventional KF40 interface. As detailed hereinbelow, plasma source 200 can also be configured to mate to other conventional or even proprietary interface designs, such as other KF interfaces, ASA interfaces, ConFlat or CF interfaces, or other vacuum flange types.

Figure 3A:
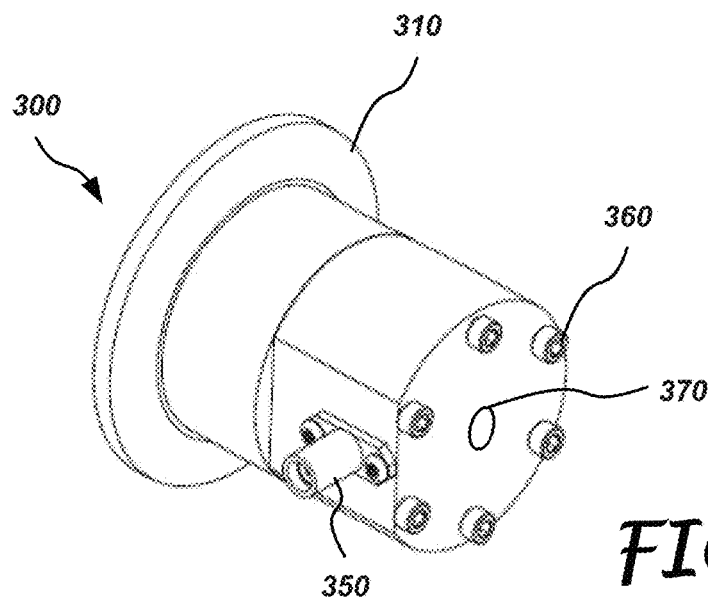
FIG. 3A illustrates a three-dimensional view of an embodiment of a ¼-wave plasma source constructed according to the principles of the disclosure.
Figure 3B:
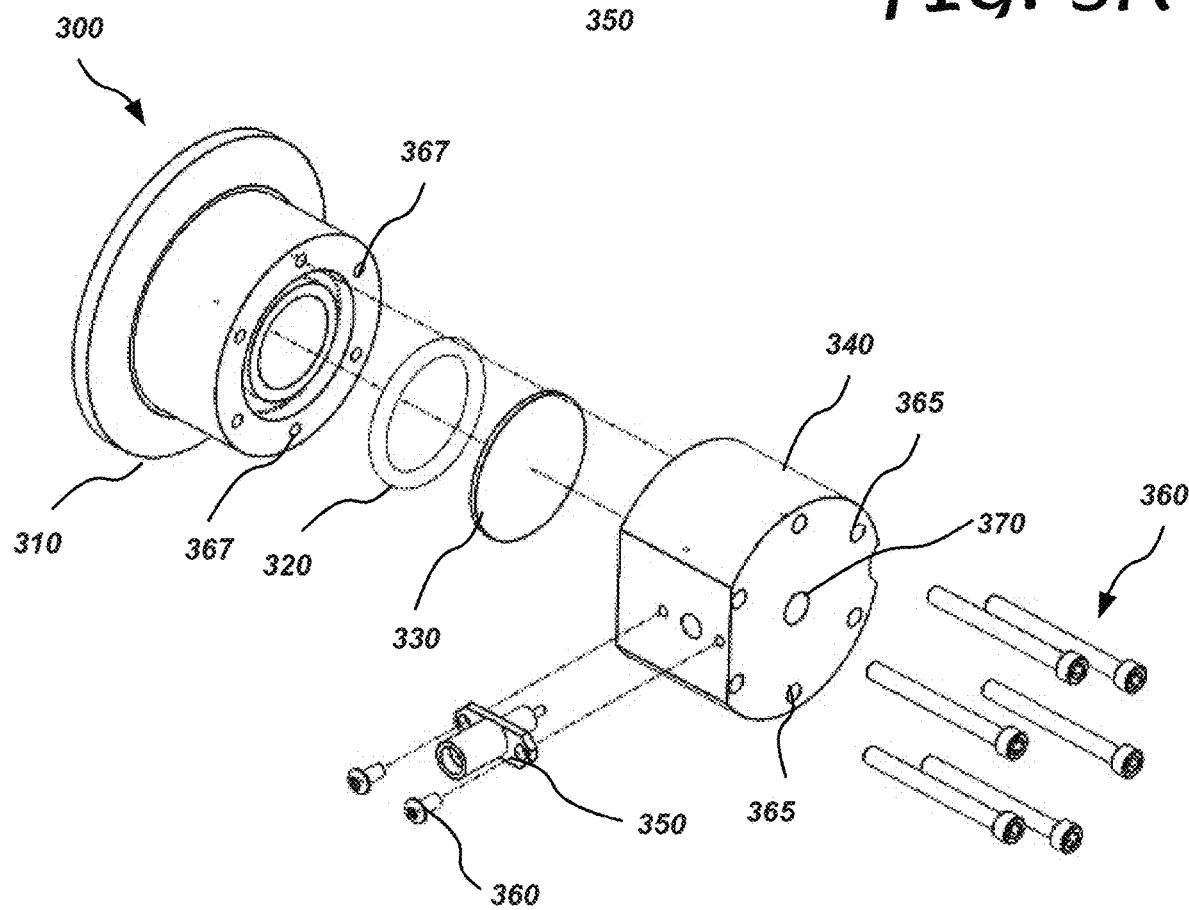
FIG. 3B illustrates an exploded view of the plasma source of FIG. 3A.

FIG. 3A illustrates a three-dimensional view of an embodiment of a ¼-wave plasma source 300 constructed according to the principles of the disclosure. FIG. 3B illustrates a three-dimensional exploded view of plasma source 300 indicating principle components of the plasma source 300 and the ease of disassembly for repair and/or maintenance. Similar to plasma source 200, plasma source 300 may be conveniently assembled from mounting flange 310, o-ring 320, window 330, coaxial resonant cavity body 340, and RF signal interface 350. Mechanical fasteners can be used to connect and hold components of the plasma source 300 together and are generally denoted as element 360 in FIGS. 3A and 3B. Mechanical fasteners 360 may pass through clearance openings 365 to engage with threaded holes 367 in mounting flange 310. Mechanical fasteners can be similarly employed with clearance openings and threaded holes in other plasma sources disclosed herein.

An optical fiber access 370 is shown at an end of the coaxial resonant cavity body 340. ¼-wave plasma source 300 may have the dimensions of approximately 40 mm×40 mm×40 mm. Components of plasma source 300 may be constructed from the materials used to construct plasma source 200. The coaxial resonant cavity bodies of plasma sources 200 and 300 each have a fixed inner length that is nominally based on an odd number of a quarter lengths of the RF excitation wavelength provided via the RF signal interfaces 250, 350. Nominal inner lengths of the coaxial resonant cavity bodies, including longer 5/4-wave or 7/4-wave plasma sources, cooperate to optimize an electromagnetic (EM) field at the window.

Figure 4B:
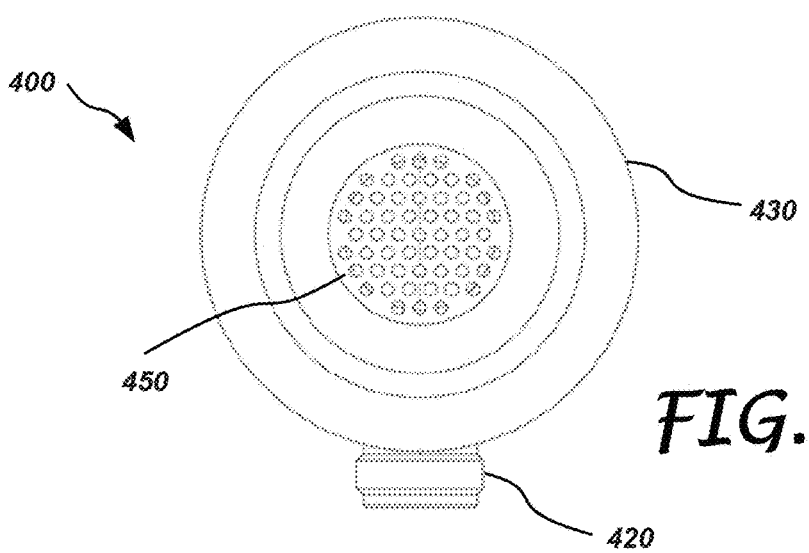
FIG. 4B illustrates an end view of the plasma source illustrated in FIG. 4A.

FIG. 4A illustrates a three-dimensional cross-sectional view of an embodiment of a plasma source 400 constructed according to the principles of the disclosure. FIG. 4B illustrates an end view of plasma source 400. The plasma source 400 includes a coaxial resonant cavity body 410, an RF signal interface 420, a mounting flange 430, a window 440, an isolation screen 450 (shown only in FIG. 4B), and a plasma cavity 460. In some embodiments, the values of inner length L1 and coupling point distance L2 of the coaxial resonant cavity body 410 are based on maximization of an electromagnetic (EM) field established at or near the process environment surface of window 440 using an RF signal received via the RF signal interface 420. Maximization of the EM field at the window 440 can cause the resultant plasma to wet window 440 thereby aiding, by sustaining an increased window temperature, self-cleaning of the window 440 by action of the excited plasma. Accordingly, plasma source 400 keeps the optical transmission properties of window 440 consistent due to reduced contamination. Other dimensions of the coaxial resonant cavity body 410 are defined by wavelength characteristics at the operating frequency of interest. The operating frequencies can be, but not required to be, within the Industrial, Scientific and Medical (ISM) bands, such as 2.4-2.5 GHz, 5.725-5.875 GHz, etc., due to international standardization for use and interference.

In some ¾-wave embodiments, the plasma source 400 can be approximately 100 mm in overall length and the inner length, indicated by dimension L1, of the coaxial resonant cavity body 410 can be approximately 70 to 95 mm and coupling point distance L2 may be approximately 10 to 80 mm. The overall length of the plasma source 400 extends from an interface 432 of the mounting flange 430 to an opening for optical fiber access 490 located at the end of the plasma source 400 opposite of the mounting flange 430. The end of the plasma source 400 opposite of the mounting flange is also a second end of the coaxial resonant cavity body 410 opposite of the process end. Specific or fixed inner lengths of the coaxial resonant cavity body 410 depend upon the actual frequency of operation and the associated free-space wavelength of the RF waves. For example, for the 2.4-2.5 GHz ISM band the wavelengths range from 125 to 120 mm and a ¾-wave resonator is approximately 90 mm in length, i.e., an inner length of 90 mm. Similarly a ¼-wave resonator is approximately 30 mm in length, i.e., an inner length of 30 mm, for the 2.4-2.5 GHz ISM band with the wavelengths range of 125 to 120 mm. Values of inner length L1 and coupling point distance L2 of the coaxial resonant cavity body 410 may be modified based upon the RF properties (complex permittivity, etc.) of window 440.

The coaxial resonant cavity body 410 is mechanically robust and designed to minimize emission of the RF signal received via the RF interface 420 except as directed through window 440 and into the plasma cavity 460 within the mounting flange 430. The coaxial resonant cavity body 410 includes an inner electrode 470 and an outer electrode 480. The RF signal interface 420 is electrically coupled to the inner and outer electrodes 470, 480, to provide excitation of the plasma source 400 via the received RF signal. Relative dimensions of inner electrode 470 and outer electrode 480 are chosen to approximate a 50 Ohm nominal impedance of coaxial resonant cavity body 410 when connected via RF signal interface 420. The relative dimensions of the inner and outer electrodes 470, 480, can vary to correspond to an impedance of the RF signal interface 420 and external RF components. In other examples, the dimensions of the inner electrode 470 and the outer electrode 480 can be chosen to approximate a 75 Ohm nominal impedance. As shown in FIG. 4A, the coaxial resonant cavity body 410 is inductively coupled to RF signal interface 420 since center conductor 422 of RF signal interface 420 is directly electrically connected with inner electrode 470. Coaxial resonant cavity body 410 may be capacitively coupled in other embodiments by extending the center conductor 422 of RF signal interface 420 into the region between outer electrode 480 and inner electrode 470 without contacting with inner electrode 470. The RF signal interface 420 is directly in contact with the outer electrode 480.

One or more tuning stubs 425 may be used to perform impedance matching with respect to the RF signal interface and/or frequency adjustment for plasma source 400. The tuning stubs 425 may be metallic or non-metallic screws or other adjustable protuberances entering into the space between the outer electrode 480 and the inner electrode 470. The amount of entry of the tuning stubs 425 into the space can be adjusted to alter the impedance and/or frequency. The number of and the placement of the tuning stubs 425 along the coaxial resonant cavity body 410 can be based on experience, test data, and electromagnetic modeling. The location of the tuning stubs 425 and the number thereof can also vary depending on the type or size of plasma source. For example, the number and location and tuning stubs can vary depending on if the plasma source is a ¼-wave or a ¾-wave plasma source. FIG. 4A shows example locations and an example of a number of tuning stubs.

The RF signal can be provided via a source controller, such as the source controller 177 of FIG. 1. As noted above, the RF signal can have a nominal frequency of 2.45 GHz within the 2.4-2.5 GHz ISM band. The RF signal interface 420 is designed to match the impedance of the cable/source delivering the RF signal, such as the cables 178 and 179, and the RF power source of the source controller 177 in FIG. 1. The RF signal interface 420 can be a 50 ohm RF connector, such as, a Type N connector, a SubMiniature version A connector, or another type of RF connector.

The mounting flange 430 is mechanically coupled to the coaxial resonant cavity body 410, with the window 440 and an o-ring 435 positioned therebetween, and the o-ring 435 positioned between the window 440 and mounting flange 430. Advantageously, the coaxial resonant cavity body 410 and mounting flange 430 are removably coupled together. The ability to easily disassemble and reassemble these components allows maintenance of the window 440 and the o-ring 435. Screws 437 or another type of mechanical fastener can be used for the removable mechanical coupling of coaxial resonant cavity body 410 and mounting flange 430. Coupling of the coaxial resonant cavity body 410 to the mounting flange 430 also provides an electrical connection through the mating surfaces of the coaxial resonant cavity body 410 and mounting flange 430 for a low resistance conductive path for RF shielding and ground.

Figure 9A:
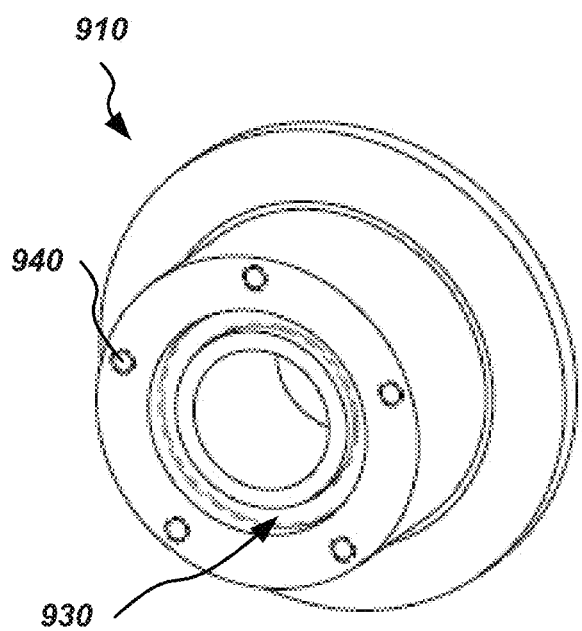
FIGS. 9A and 9B illustrate three-dimensional and cross-sectional views of mounting flanges for a plasma source constructed according to the principles of the disclosure.
Figure 9A:
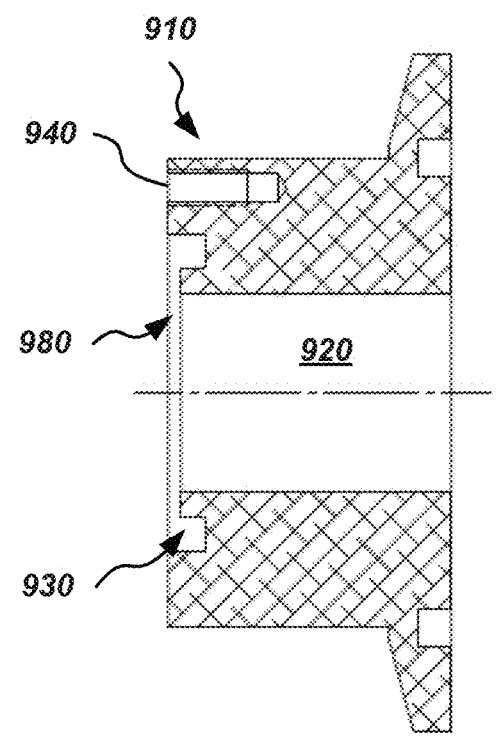
Figure 9B:
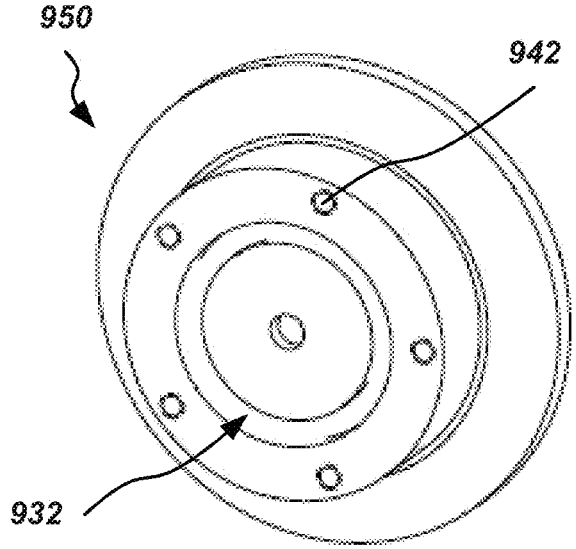
Figure 9B:
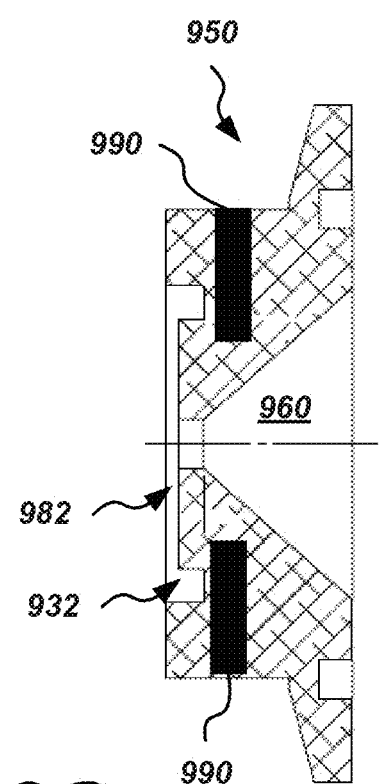

The interface 432 of the mounting flange 430 is configured to connect to an interface for communication with gas or gases from a process chamber. The interface 432 of the mounting flange 430 can be for, for example, a KF40-style connector. The interface 432 can vary depending on the type interface in which to connect. Additionally, such as illustrated in FIGS. 9A and 9B, the plasma cavity of mounting flanges used with the coaxial resonant cavity body 410 can vary and still provide decoupling between the coaxial resonant cavity body 410 and the process volume with limited impact upon the operational characteristics of the plasma source 400. O-ring 435 can be constructed of a material such as Kalrez perflouroelastomer that is typically used in the industry to withstand the process gas, pressure, and heat.

In addition to adapting to interfaces for mounting, the mounting flange 430 mechanically supports the coaxial resonant cavity body 410 of the plasma source 400. Mounting flange 430 can also support the isolation screen 450 if used. Isolation screen 450 includes openings or holes to regulate effusion of the process gas between the plasma cavity 460, defined by the inner surfaces of the mounting flange 430, and the process volume, such as in a process chamber. Isolation screen 450, furthermore, may inhibit migration of plasma excited near window 440 from entering the main portions of the attached process volume. The isolation screen 450 can be used in some applications where contamination can be a concern, such as when coupled to a process chamber as indicated by plasma source 150 of FIG. 1, and not used in some applications when contamination is less of a concern, such as in foreline locations as indicated by plasma source 150' of FIG. 1.

The isolation screen 450 can be attached to the mounting flange 430 and be positioned coincident with the interface 432 or at other locations within plasma cavity 460. The isolation screen 450 can be made of the same material as the mounting flange 430. For example, the isolation screen 450 can be constructed of aluminum. The isolation screen 450 can be removably attached to the mounting flange 430, such as via a clamp or threaded connection, or can be permanently attached, such as via welds. Isolation screen 450 may also be a non-integral part of plasma source 400 and for KF-type interfaces an appropriately designed screened centering ring may be used. The inner surfaces of the plasma cavity 460 which may be contacted by plasma and/or process gasses can be coated with zirconia, yttria, refractory oxide, or another similar product to reduce contamination and damage due to the process gas. Window 440 can also be constructed of a conventional material that is used to resist contamination due to the process gas. For example, the window 440 can be a sapphire or fused silica window.

In addition to isolating the majority of the plasma source 400 from the process volume, the window 440 provides for transmission of the RF energy into the plasma cavity 460 and for transmission of optical emissions generated by excitation of plasma 465 in plasma cavity 460. As stated above, one side of the window 440, process side 444, is in gaseous contact with the environment of a process volume, and the other side of the window 440, ambient side 448, is conveniently at ambient conditions.

An optical fiber assembly (not shown) can be placed within inner electrode 470 via the optical fiber access 490 located at the end of the plasma source 400 opposite of the mounting flange 430. The optical fiber assembly can provide optical signals to a spectrometer, such as spectrometer 160 in FIG. 1. Aperture 495 is positioned near window 440 to permit direct access and strong coupling of the optical fiber assembly to the optical emissions provided by plasma 465. Aperture 495 is designed to limit impact on the production and localization of the EM fields and resultant plasma. The aperture 495 is an optical signal aperture that is typically small compared to the RF excitation wavelength, approximately of 1 mm diameter, and is positioned to provide a view of the plasma accessible by the optical fiber cable assembly. The optical fiber assembly (not shown in FIG. 4A) may have a cylindrical cross-section and retained by a set screw or other fastener into optical fiber access 490.

In some applications, a magnet can be used to provide magnetic confinement around the plasma cavity 460 of the plasma source 400 to support electron cyclotron resonance and assist in igniting and sustaining the plasma 465 at lower RF powers or over a wider pressure range. A magnet or magnets may be placed about or embedded within mounting flange 430. FIG. 9B illustrates cylindrical magnets embedded into a mounting flange and FIG. 10B illustrates a neodymium ring magnet placed about a mounting flange. For a nominal working condition of 2.45 GHz excitation, a field of 875 Gauss can be used to support electron cyclotron resonance; other magnetic field strengths can also be used.

As noted above, positioning of the aperture 495 and the optical fiber is coordinated with plasma excitation. To further assist in defining a location of plasma excitation within plasma cavity 460, the end of the inner electrode at the window 440, referred to as window end 497, can be shaped. The location of the aperture 495 can also change to correspond to the shape of the inner electrode 470 at the window end 497. Accordingly, optical fiber access can change to coincide with the aperture 495. FIGS. 5A-5D illustrate three-dimensional views of embodiments of coaxial resonant cavity bodies of plasma sources constructed with variously shaped window ends of inner electrodes according to the principles of the disclosure.

Figure 5A:
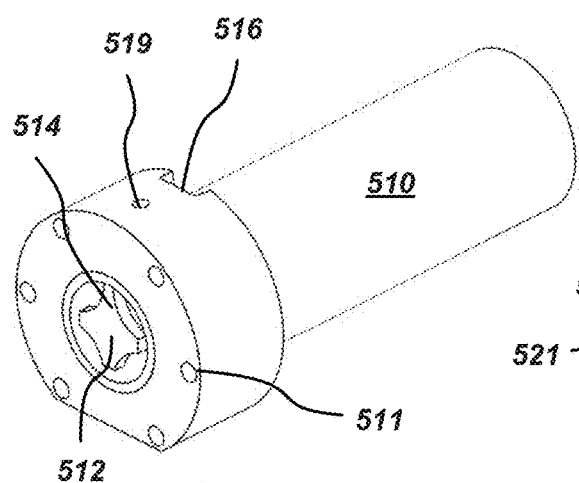
FIGS. 5A-5D illustrate three-dimensional views of embodiments of other plasma sources constructed according to the principles of the disclosure.
Figure 5B:
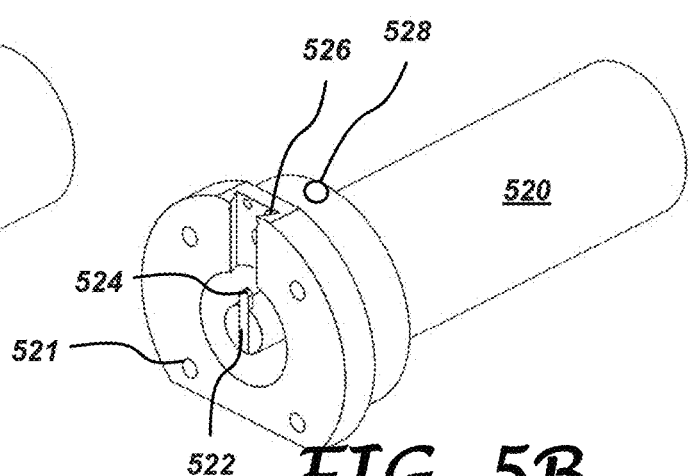
Figure 5C:
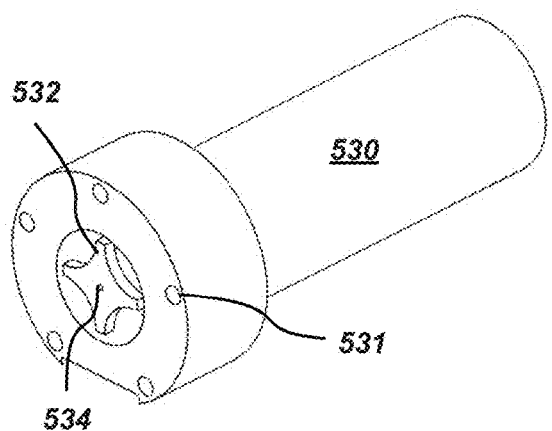
Figure 5D:
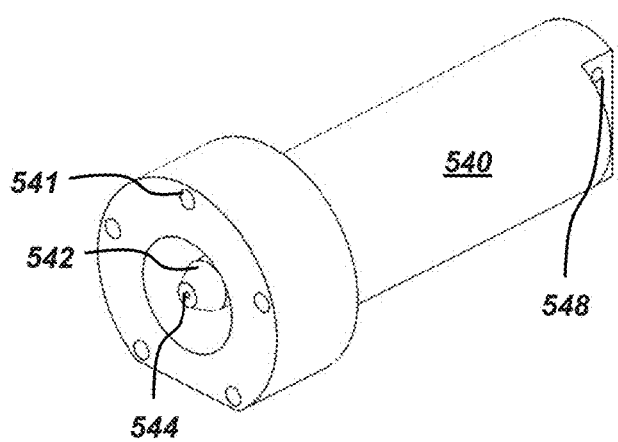

FIG. 5A illustrates a coaxial resonant cavity body 510 having a window end 512 of an inner electrode in a shape of a cross with 4 asymmetric arms. This configuration of window end 512 localizes the plasma excitation near the position of a longest arm 514. Accordingly a location of an optical fiber access 516 is repositioned. In this embodiment, the optical fiber is no longer directed axially within the inner electrode but instead is positioned through the optical fiber access 516 and aligned with a gap between longest arm 514 and the inner diameter of the outer electrode of the coaxial resonant cavity body 510. A setscrew can be used in opening 519 to hold the optical fiber in place. FIG. 5B illustrates a coaxial resonant cavity body 520 having a window end 522 of an inner electrode in a shape having a single point 524 opposite an adjustable keyway 526 for altering a distance from the point 524 to inner surface of the outer electrode of the coaxial resonant cavity body 520. An optical fiber may be inserted into optical fiber access 528 and aligned with a gap between point 524 and the adjustable keyway 526. FIG. 5C illustrates a coaxial resonant cavity body 530 having a window end 532 of an inner electrode in a shape of a cross having symmetric rounded arms. An aperture 534 is located in a center of the window end 532. In this embodiment, the optical fiber can be directed axially within the inner electrode of the coaxial resonant cavity body 530. FIG. 5D illustrates a coaxial resonant cavity body 540 including a window end 542 of an inner electrode in a shape of a frustum of a cone. An aperture 544 is located in a center of the frustum of the cone of window end 542. Coaxial resonant cavity body 540 further includes recess 548 configured to receive a mounting bracket, such as mounting bracket 1040 of FIG. 10A. In this embodiment as with the coaxial resonant cavity body 530, the optical fiber can be directed axially within the inner electrode of the coaxial resonant cavity body 540. The coaxial resonant cavity bodies of FIGS. 5A-5D may be connected with mounting flanges or other mounting surfaces via mechanical fasteners placed through openings 511, 521, 531 and 541.

To support configurability of the plasma source, the various different window ends may be removably mechanically attached to an adaptable inner electrode. FIG. 6A illustrates a cross-sectional view of a coaxial resonant cavity body 600 assembled from adaptable inner electrode components 610 and 620 illustrated in FIGS. 6B-6D. Inner electrode body 610 includes a female threaded portion designed to receive the male threaded portion of window end 620. When assembled together, inner electrode body 610 and window 620 provide an inner electrode 630 of coaxial resonant cavity body 600. The coaxial resonant cavity body 600 also includes an outer electrode 640, a through holes 650 for fasteners, and an aperture 660. The assembled inner electrode 630 corresponds to the inner electrode of FIG. 5C. The coaxial resonant cavity body 600 also includes bore 670 and flat portion 675 configured for installation of an RF signal interface such as interface 250 of FIG. 2A.

Figure 7A:
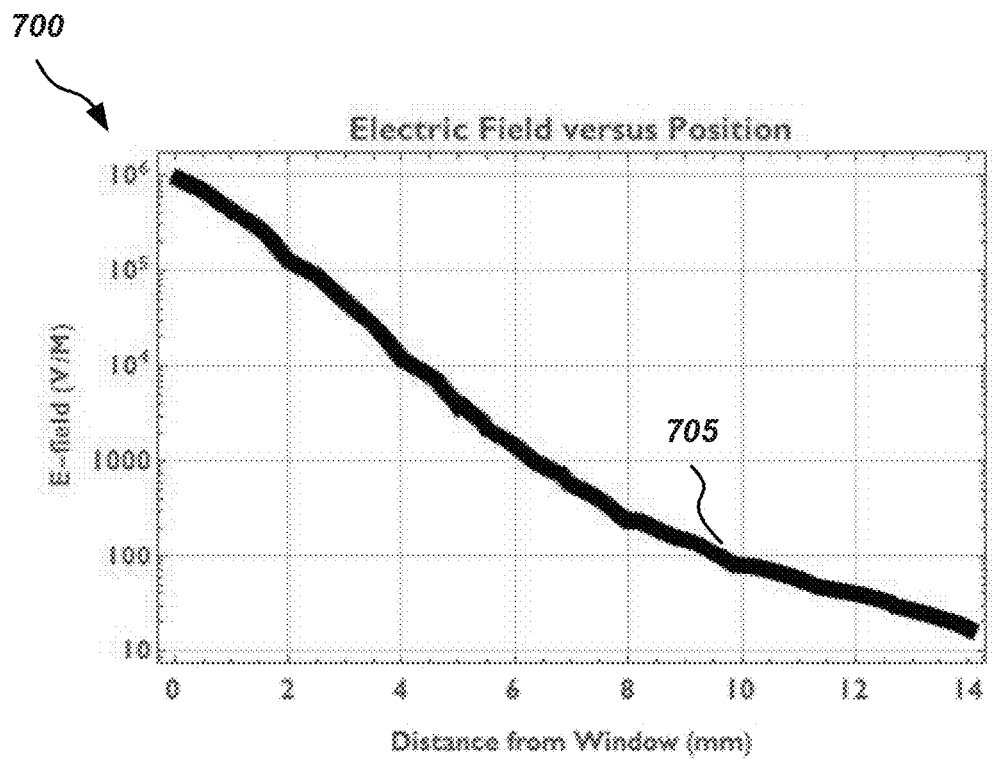
FIG. 7A illustrates a plot of electric field strength along the axis of a plasma source constructed according to the principles of the disclosure.
Figure 7B:
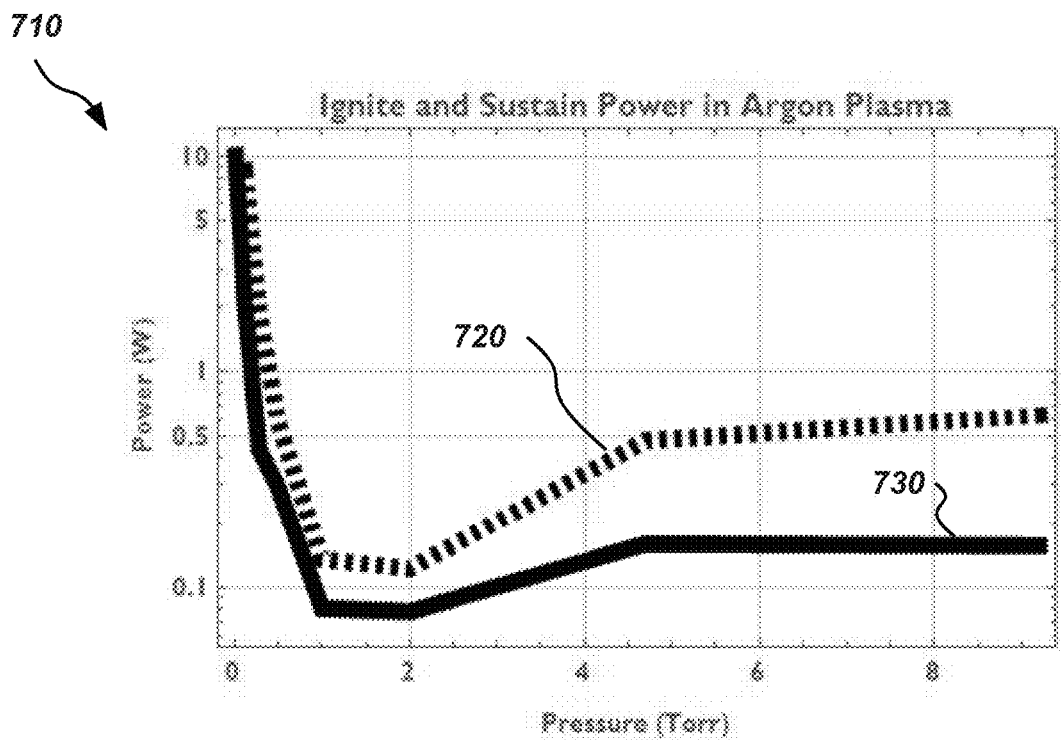
FIG. 7B illustrates a plot of ignition and sustaining power levels of a plasma source constructed according to the principles of the disclosure.

The coordination of design of the inner electrode, window and aperture seeks to provide optimized RF power delivery for plasma excitation and localization of the plasma for convenient and efficient collection of optical emission signals. Accordingly, the coordination of design is directed to providing a plasma near the window surface and at the observation point of the fiber optics. Localization of the plasma may be associated with concentration of the electric field provided by the RF source and shaped by the coaxial resonant cavity. FIG. 7A illustrates an electric field strength graph 700 that indicates the strong localization of the field at a window of a plasma source. The graph 700 includes a plot 705 that shows the decrease in magnitude or strength of an electric field in volt/meters as the distance from the window increases. The graph 700 is created from a model of a ¾-wave design of a plasma source such as disclosed herein before ignition of the plasma. The plasma source used for graph 700 includes a window end 542 shown in FIG. 5D. FIG. 7B illustrates the power performance results from graph 700.

FIG. 7B illustrates a graph 710 showing the power of an RF signal source versus the pressure within a plasma cavity of a plasma source constructed according to the principles of the disclosure. The graph 710 illustrates the ignition and sustaining power performance of a ¾-wave plasma source with an inner electrode having a window end 542 as shown in FIG. 5D. The dashed plot 720 is the ignition or excitation power level and the solid plot 730 is the sustaining power level. Specifically, this plasma source may ignite at power levels less than 200 mW (dashed curve 720) and may be sustained at power levels less than 100 mW (solid curve 730). As expected from Paschen's law, the power versus pressure curves show generally higher required power levels with decreasing pressure. For certain operating scenarios, a plasma source may be ignited at a higher pressure and associated lower power condition and sustained at that same or different power condition while the pressure is reduced to a lower level.

Figure 8:
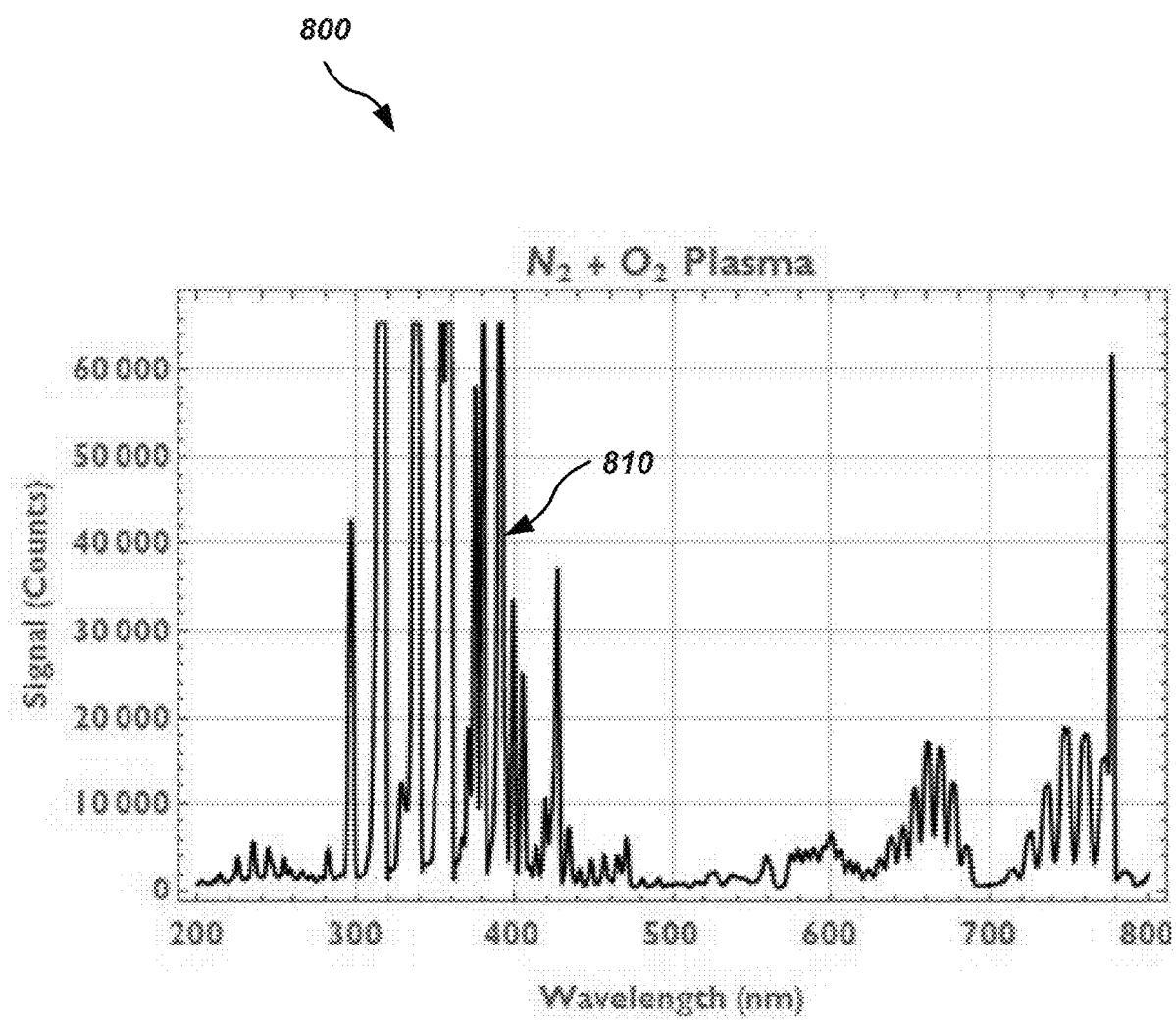
FIG. 8 illustrates a plot of an example spectrum provided by a plasma source constructed according to the principles of the disclosure.

FIG. 8 illustrates a graph 800 of an example spectrum 810 provided by a plasma source with electric field strength such as represented in FIG. 7A and power performance of a plasma source such as represented in 7B. The spectrum can be provided by a spectrometer, such as spectrometer 160 in FIG. 1. Localization of the plasma, low power operation, and efficient optical coupling provides large optical signals as shown in the spectrum 810. For the spectrum 810, a plasma of mixed nitrogen and oxygen gas is ignited and sustained at approximately 200 millitorr pressure and 300 mW of applied RF power at 2.410 GHz excitation. Low power operation of the plasma source, such as at 300 mW, results in reduced disassociation of the excited gasses permitting expression of atomic and molecular spectral features which may be useful in process analysis of polyatomic species and determining chemical compounds.

Adaptability of the plasma sources described herein advantageously allows connecting the coaxial resonant cavity bodies disclosed herein to multiple interfaces and locations. FIGS. 9A and 9B illustrate views of mounting flanges for a plasma source constructed according to the principles of the disclosure. Differing chamber interfaces and differing requirements for gas flow may impact the design of a mounting flange. In general, a mounting flange with minimal volume advantageously mitigates a slow response due to gas transport. This benefit, however, needs to be balanced against mechanical requirements for mounting.

Certain mounting flange features, such as flange inner diameter, aid in localization of the EM fields and the resultant plasma. Relatedly, it is advantageous to inhibit the plasma from direct contact with the metal parts of the mounting flange due to erosion and particle formation. Due to exposure from the plasma, the inner diameter of the mounting flanges can be coated for protection. FIG. 9A and FIG. 9B illustrate two examples of mounting flanges having a different plasma cavity shape and volume.

The mounting flange 910 shown in FIG. 9A has a cylindrical inner bore forming plasma cavity 920 allowing ease of gas flow and a larger open area near a window which will tend to delocalize the plasma. The mounting flange 910 includes a window recess 980 and o-ring groove 930 for housing the window and an o-ring. The mounting flange 910 also includes openings 940 for receiving fasteners for connecting a coaxial resonant cavity body to the mounting flange 910.

Mounting flange 950 shown in FIG. 9B has a shortened and tapered inner bore compared to mounting flange 910 of FIG. 9A. The tapered inner bore forms plasma cavity 960. The smaller open area near a window results in higher localization of the plasma. The smaller open area of the plasma cavity 960 can inhibit gas flow. In some embodiments, the inhibition to gas flow may be partially mitigated by increasing the process side diameter of the plasma cavity 960 and shorting the overall length of the mounting flange 950. The mounting flange 950 includes a window recess 982 and o-ring groove 932 for housing the window and an o-ring. The mounting flange 950 also includes openings 942 for receiving fasteners for connecting a coaxial resonant cavity body to the mounting flange 950. The mounting flange 950 further includes magnets 990 which are shown embedded but may protrude from mounting flange 950. The cross-sectional view of mounting flange 950 shown in FIG. 9B indicates how the tapered inner bore of the mounting flange 950 supports embedding of magnets 990 into the mounting flange 950. The magnets 990 in this configuration may be poled to provide a magnetic field perpendicular in relation to the electric component of the EM field (i.e., radially poled with respect to the cylindrical axis of the plasma source).

The fast decay of the EM field away from the window reduces coupling of the design of the flange from the coaxial resonant cavity body and window. Therefore the coaxial resonant cavity body may be considered "universal" and other mounting arrangements may be readily adapted to suit the requirements for installation of the plasma source. In certain embodiments, an independent mounting flange may not be used and appropriately designed features for an o-ring and window may be constructed directly on a chamber, foreline, or other mounting location. Accordingly, mechanical fasteners, such as the screws 437 in FIG. 4 can be used to connect a coaxial resonant cavity body to an interface without a mounting flange.

In some applications without a mounting flange, the mechanical fasteners can be used to affix a coaxial resonant cavity body to an interface and secure the o-ring and window in-between. Although mounting flanges 910 and 950 indicate the use of mechanical fasteners to join a mounting flange and a coaxial resonant cavity body, joining may be performed via other means, for example, by supplying a coaxial resonant cavity body with a male threaded portion that may engage with a female threaded portion of a mounting flange or vis-versa. Furthermore window recesses such as 980 and 982 may be formed, in total or partially, in a portion of a coaxial resonant cavity body instead of a mounting flange.

Figure 10A:
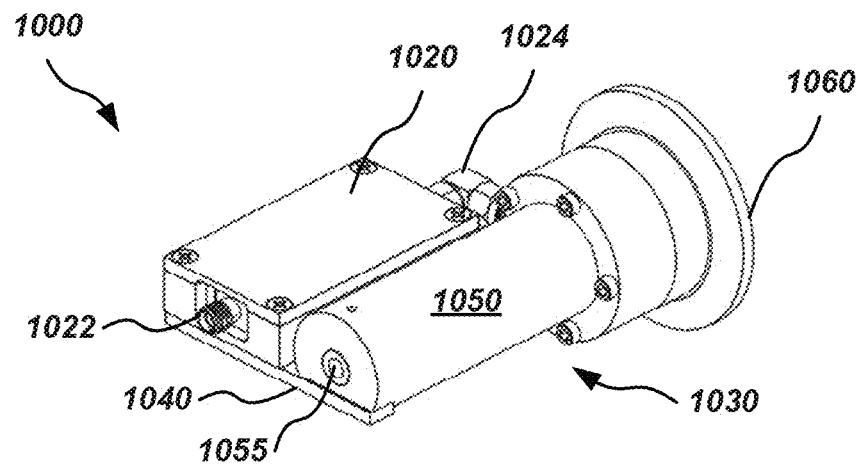
FIG. 10A illustrates a three-dimensional view of an embodiment of a plasma source system with external RF match/tuner and mounting flange constructed according to the principles of the disclosure.
Figure 10B:
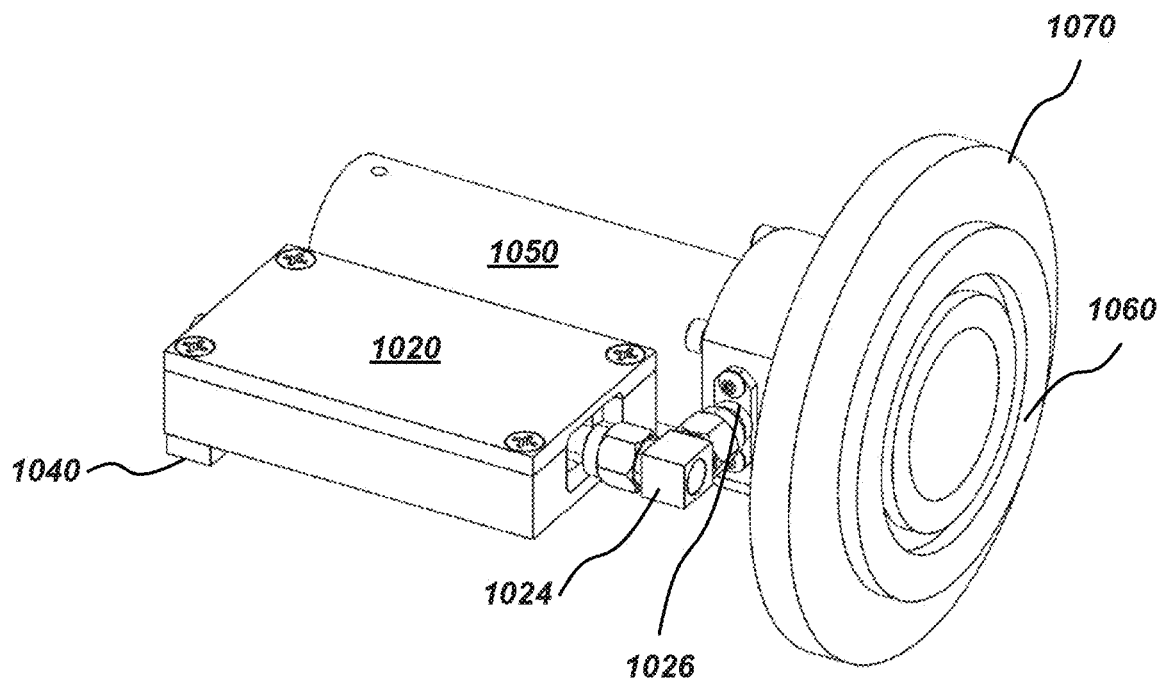
FIG. 10B illustrates a three-dimensional view of the plasma source system of FIG. 10A including a neodymium ring magnet about the mounting flange.

FIG. 10A illustrates a three-dimensional view of an embodiment of plasma source system 1000 with external RF match/tuner 1020 connected to a plasma source 1030 via a mounting bracket 1040. The plasma source 1030 includes a coaxial resonant cavity body 1050 and mounting flange 1060 constructed according to the principles of the disclosure. Coaxial resonant cavity body 1050 includes axially oriented optical fiber access 1055. Due to variations in manufacturing and performance of RF components, impedance matching is commonly required. An external tuner, such as RF match/tuner 1020 may be used for the impedance matching. Tuner 1020 may include a tuning circuit based upon a "tuning pad" array serially connected between the RF supply via RF connection 1022, such as the RF source controller 177 of FIG. 1 and the plasma source, such as source 200 of FIG. 2A. The tuner 1020 is also connected to an RF signal interface mounted to coaxial resonant cavity body 1050 via an elbow connector 1024. The RF signal enters at RF connection 1022, passes through the circuit board inside of RF match/tuner 1020, enters the RF elbow connector 1024, and then connects to a RF signal interface 1026 (not shown in FIG. 10A) mounted to the coaxial resonant cavity body 1050.

Figure 11:
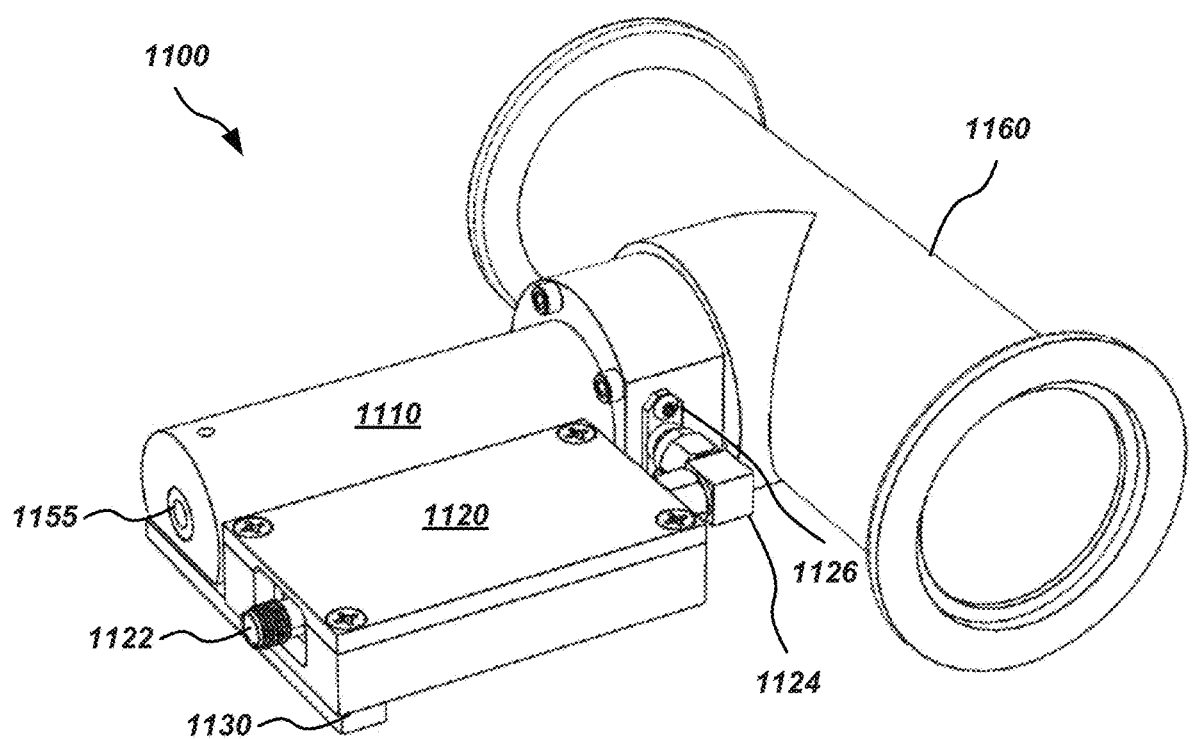
FIG. 11 illustrates a three-dimensional view of an embodiment of another plasma source system with external RF match/tuner and flow by mounting arrangement constructed according to the principles of the disclosure.

FIG. 10B illustrates a three-dimensional view of the plasma source system 1000 of FIG. 10A including a neodymium ring magnet 1070 about the mounting flange 1060. A magnet in this configuration may be axially poled to provide a parallel or antiparallel magnetic field in relation to the electric component of the EM field (i.e., axially poled with respect to the cylindrical axis of the plasma source 1030). FIG. 10B also illustrates the RF signal interface 1026 not shown in FIG. 10A In certain implementations, it may be useful to permit gas to be swept past the excitation region near the window. FIG. 11 illustrates a three-dimensional view of an embodiment of another plasma source system 1100 with a coaxial resonant body cavity 1110 connected to an external RF match/tuner 1120 by a mounting bracket 1130. The coaxial resonant cavity body 1110 includes an axially oriented optical fiber access 1155. The tuner 1120 includes a RF connection 1122 and is also connected to an RF signal connector 1126 of the coaxial resonant cavity body 1110 via an RF elbow connector 1124. The "side-by-side" mechanical positioning of tuner 1120 and coaxial resonant cavity body 1110 may be varied and, for example, RF elbow connector 1124 may be removed and tuner 1120 may be positioned "parallel" to tube assembly 1160. In this flow-by arrangement, the "universal" coaxial resonant cavity body 1110 is attached to the side of an appropriately designed tube assembly 1160. This configuration may be utilized in forelines, such as indicated by plasma source 150' of FIG. 1. and differentially pumped applications where response times are critical. In another embodiment, tube assembly 1160 may not be used and coaxial resonant cavity body 1110 may be mounted to a flat surface such as the exterior wall of a chamber such as indicated by the location of plasma source 150 in FIG. 1.

Figure 12:
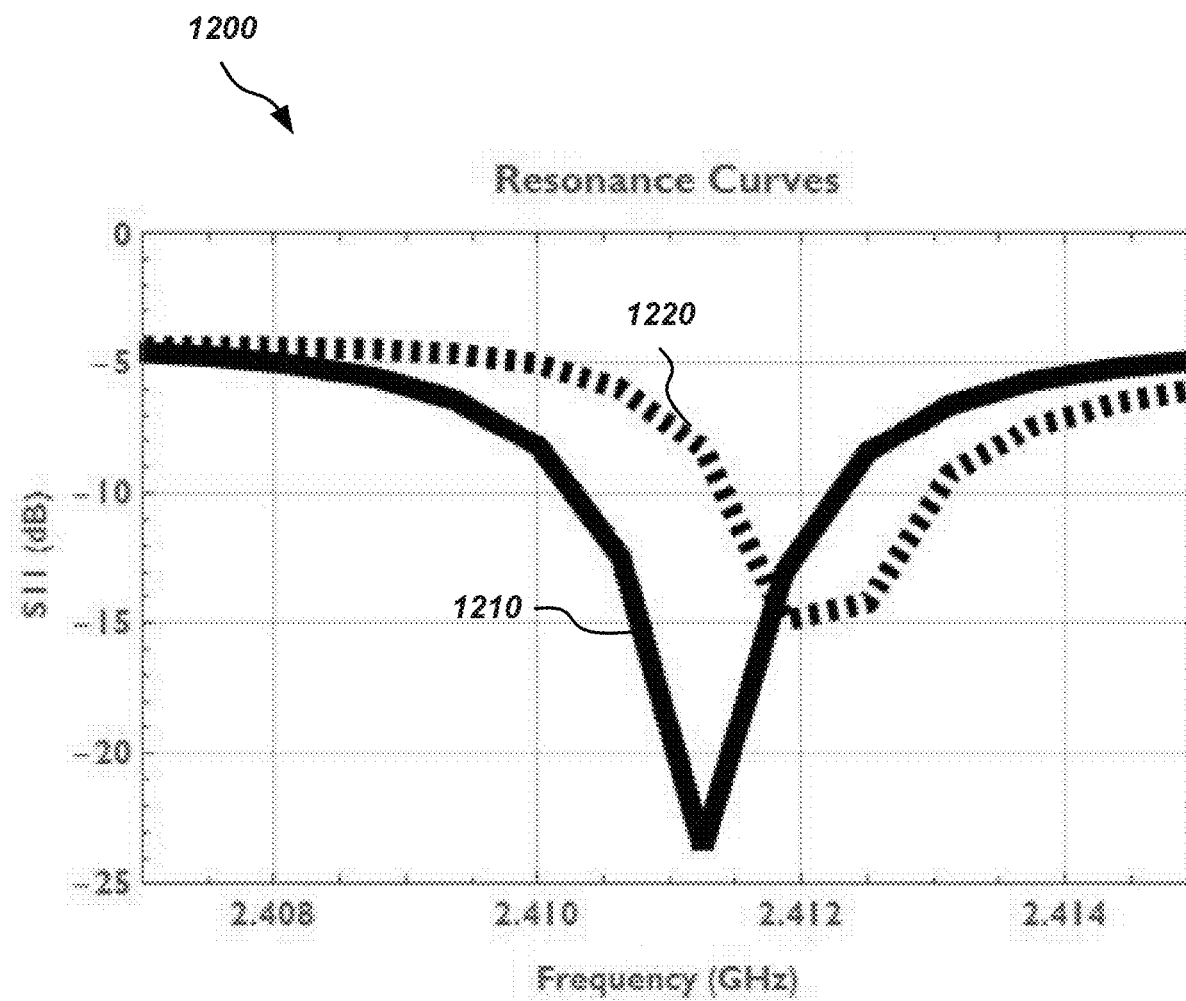
FIG. 12 illustrates a plot of example resonance behavior of a plasma source constructed according to the principles of the disclosure.

The resonant cavity plasma sources described herein are designed to reduce the impacts of the various operating conditions provided by the process environment such as pressure loading of the cavity resulting in changes of resonance frequency, cavity Q, reflected power, voltage standing wave ratio (VWSR), etc. However, these impacts require some accommodation. FIG. 12 illustrates a plot 1200 of example resonance behavior changes of a plasma source such as shown in FIG. 10B. Solid curve 1210 indicates the resonance conditions prior to plasma ignition and dashed curve 1220 indicates the resonance conditions while the plasma source is excited and providing sustained optical emission. Comparing the resonance prior to plasma ignition as indicated by the solid curve 1210 to the resonance while the plasma source is excited from the dashed curve 1220 indicates the resonance frequency is shifted approximately 1 MHz and the S11 (input return loss) increases from approximately −25 to −15 dB. Essentially, the plasma acts as a load coupled to the coaxial cavity resonator. The plasma loading results in less efficient power transmission and changes the excitation of the plasma further driving changes in the optical emission signals from the excited plasma. Resultant optical emission signal instability is not desired for process control and can require compensation. Instability may manifest as changes in optical emission signal amplitude or changes in spectral features.

Figure 13:
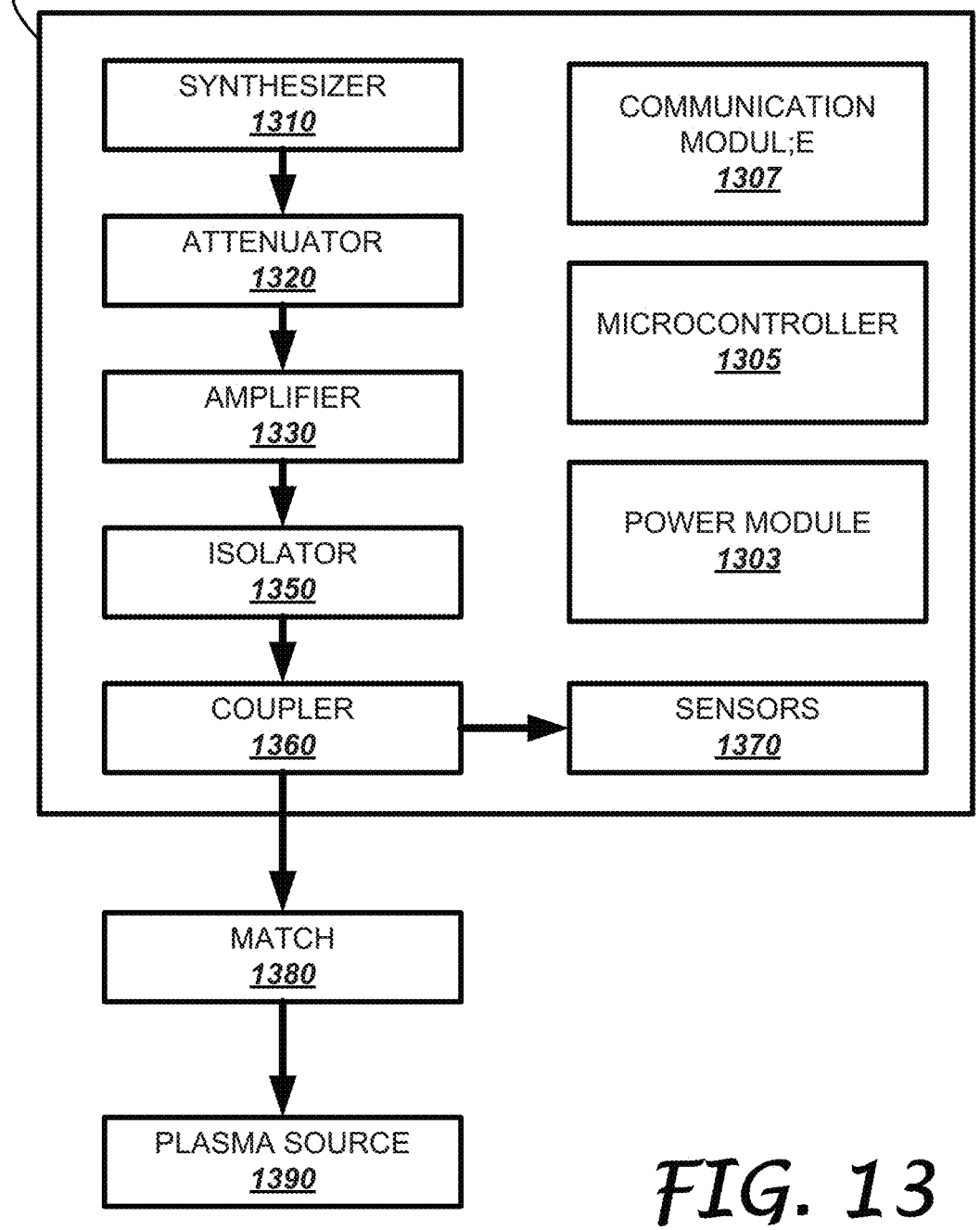
FIG. 13 illustrates a block diagram of a source controller for a plasma source constructed according to the principles of the disclosure.

For these purposes a source controller can be used. FIG. 13 illustrates a block diagram of a source controller 1300 for a plasma source constructed according to the principles of the disclosure. The source controller 1300 is configured to provide an RF signal to an RF signal interface of a plasma source and control an amount of power, phase and a frequency of the RF signal. If the RF signal is pulsed, source controller 1300 may also regulate the periodicity and duty cycle of any pulsed RF waveforms. The RF signal provided to the plasma source is used to generate an EM field that is delivered to ignite and sustain a plasma, such as in a plasma cavity of the plasma source. The source controller 1300 may be stand-alone or may be integrated with other controlling devices, such as spectrometer 160, computer 170 and chamber controller 175 of FIG. 1.

Source controller 1300 includes components to define and control the RF signal. Multiple configurations of suitable RF signal chains for defining and controlling the RF signal may be devised. The configuration defined herein provides, at least, the desired frequency, signal level and signal stability, and signal level measurement capabilities useful for operation of the plasma source. Source controller 1300 includes a synthesizer 1310, an attenuator 1320 (may be analog, digital or integrated with bias control of the amps), amplifier 1330 (may include one or more amplifiers or pre-amplifiers), an isolator 1350, a bidirectional coupler 1360, and power sensors 1370. External to the source controller (or integrated) may be a match network 1380 (such as tuner 1020 of FIG. 10A) that is then connected to the plasma source 1390. The source controller 1300 may not include or may not activate all of these components in every application. For example, bidirectional coupler 1360 and power sensors 1370 may not be included, such as, when monitoring of the forward/reflected RF power is not desired. Additionally, for certain RF amplifier configurations isolator 1350 may be excluded, for example, where feedback is not a concern.

The synthesizer 1310 is configured to generate an RF signal including setting a frequency, phase and power for the RF signal. The synthesizer 1310 receives DC power from a DC power source for generating the RF signal. The synthesizer 1310 also receives instructions from a user or external controller to establish the frequency, phase and the power. The synthesizer 1310 can also receive instructions from a spectrometer or another optical monitoring device that is coupled to the plasma source and employ the instructions to alter the power or frequency. For example, feedback from a spectrometer can indicate the ignition of plasma within a plasma cavity of the plasma source and allow the synthesizer 1310 to reduce power for maintaining excitation of the plasma. One suitable RF synthesizer is the model ADF4355 available from Analog Devices of Norwood, Mass., USA The DC power source can be a conventional DC source and the synthesizer 1310 can receive the DC power via conventional power connections and interfaces.

The attenuator 1320 receives an RF signal from the synthesizer 1310 and attenuates the RF signal to a desired level. One suitable attenuator is the model F1956 digital step attenuator available from IDT of San Jose, Calif., USA. The amplifier 1330 receives the attenuated RF signal from the attenuator 1320 and boosts the attenuated RF signal by a fixed or variable gain factor. Amplifier 1330 may be a single or multiple amplifiers or pre-amplifiers as required to provide the desired gain. A suitable amplifier may be designed around the CGH27030 HEMT from Cree of Durham, N.C., USA. The isolator 1350 is configured to protect components of the source controller 1300 from reflected power. Suitable isolators are available from Skyworks of Woburn, Mass., USA.

The bidirectional coupler 1360 is configured to tap the amplified RF signal and provide the tapped signal to power sensors 1370. Power sensors 1370 detect the gain and phase (or forward/reflected RMS power) of the amplified RF signal. Output from the power sensors 1370 may be used to adjust RF power levels provided by source controller 1300 or to adjust the match network 1380. Values from the power sensors 1370 may also be transferred to an external system, such as spectrometer 160 of FIG. 1, and considering correlation between RF signal level and optical signal level may be used to normalize optical signal levels for improved optical signal analysis. Bidirectional couplers may be sourced from multiple suppliers such as Pasternak. The match network 1380 is configured to provide impedance matching for delivering the amplified RF signal to the plasma source 1390.

Source controller 1300 may include a communication module 1307 for providing communication to external systems such as computer 170 or spectrometer 160 of FIG. 1. Source controller 1300 may use USB, Ethernet, or other communication protocols. For example, the synthesizer 1310 can receive instructions via the communication module 1307. As synthesizer 1310 and other elements of source controller 1300 may be serial peripheral interface (SPI) or inter-integrated circuit (I2C) bus devices; microcontroller 1305 may be used to control internal components of source controller 1300. Power module 1303 may receive external 24 VDC power and convert to necessary 3.3 or 5 VDC voltages for use with internal components. Components of source controller 1300 may be suitably integrated into an RF shielded housing or box to limit RF signal emissions and provide external coaxial RF connections. Source controller 1300 may provide a variable nominal output level 0.01 to 40 watts over a frequency range such as 2.4-2.5 GHz. Signal level and frequency adjustment may be continuous or discrete. For example, signal level adjustment by 10 milliwatt steps and frequency adjustment by 1 MHz steps may be used. To maintain excitation of the plasma during adjustment, source controller 1300 should not mute the RF signal during transitions.

Figure 14:
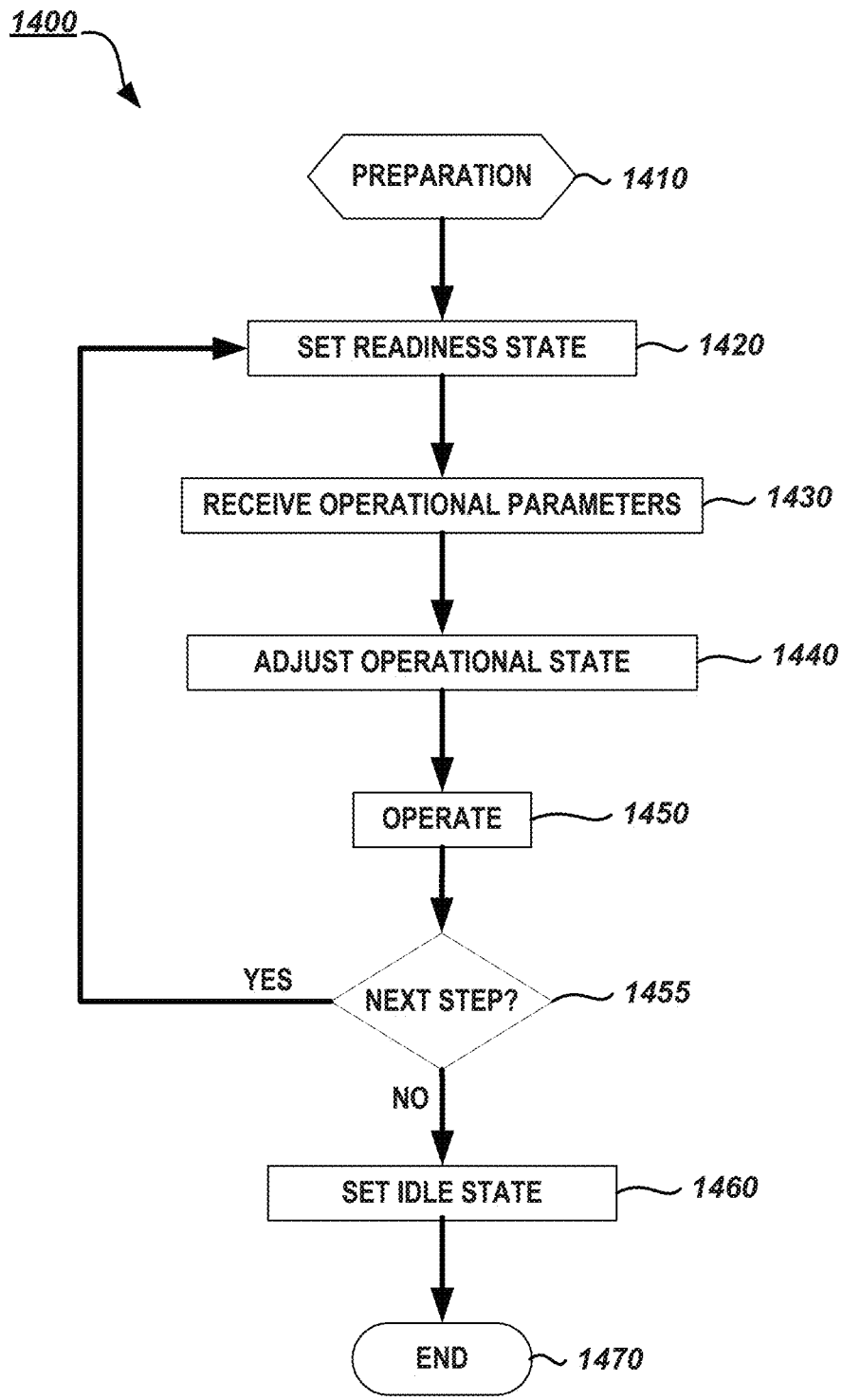
FIG. 14 illustrates a flow chart for a process for operating a plasma source or a portion thereof constructed according to the principles of the disclosure.

Semiconductor processes often involve multiple process steps in the same chamber where different treatments are applied to a wafer. The plasma sources, plasma source systems, or portions thereof disclosed herein may be used for one or more of these process steps. Since stability of process control is critical for producing the necessary changes to wafers, the stability of a plasma source monitoring any process is also critical. Given that the plasma source excites the process gas and heat is produced, the plasma source has a stability time constant that should be considered. Furthermore, sustaining elevated temperature of the window of the plasma source may inhibit accretion of contaminants on the window. In light of this, FIG. 14 illustrates a flow chart for a process 1400 for operating a plasma source or a portion thereof constructed according to the principles of the disclosure during a multiple step semiconductor process.

The method 1400 may employ one of plasma sources as disclosed herein and starts in preparation step 1410. Preparation may include the review of the duration, pressure, and gasses used for each process to define an effective readiness state for a plasma source. In a step 1420, a readiness state may be set by a source controller for a plasma source. A readiness state may include setting of a predetermined RF signal level and frequency for a plasma source. For example, the RF signal level may be set at a high level, e.g., 10 Watts, to support rapid warm-up of the plasma source and its components. Step 1420 may be enacted sufficiently prior to any first process step to monitor to ensure that adequate warm-up time is provided. Following step 1420, operational parameters for the plasma source during an upcoming process step may be received at a source controller in step 1430. Operational parameters may include predetermined RF signal level and frequency for a plasma source selected to provide optical signal levels required for the monitoring of the upcoming process step. For example, the RF signal level may be set based upon the gasses and pressures of the process step to a value of 100 mW to avoid excessive optical signals collected at a spectrometer.

Subsequent to receipt of the operational parameters, in step 1440 these parameters may be applied to the plasma source to adjust its operational state. Once the appropriate operation state has been achieved, the plasma source may be permitted to operate, during step 1450, for the duration of the current process step. The method 1400 then continues to step 1455 where a determination is made if there are additional process steps to monitor, If there are additional process steps, the process 1400 returns to step 1420 and re-establishes the readiness state of the plasma source for the additional process step. If no additional process step are to be performed or do not require monitoring, the method 1400 continues to step 1460 where the plasma source can be set to an idle state. An idle state may have the same conditions as a readiness state, operational state or may "turn-off" the plasma source. For example, the idle state may reduce the RF signal to an off state when the semiconductor chamber will pass through an operating condition where the pressure is out of range to support operation of the plasma source such as during a venting cycle to remove a wafer from a chamber. Process 1400 ends with step 1470 and at this time a plasma source may be shutdown or prepared for a new monitoring cycle.

The above-described apparatuses, systems or methods or at least a portion thereof may be embodied in or performed by various processors (such as the controllers and computers of FIG. 1), such as digital data processors or computers, wherein the processors are programmed or store executable programs or sequences of software instructions to perform one or more of the steps of the methods or functions of the apparatuses or systems. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods or functions of the system described herein.

Certain embodiments disclosed herein may further relate to or include computer storage products with a non-transitory computer-readable medium that have program code thereon for performing various computer-implemented operations that embody at least part of the apparatuses, the systems or carry out or direct at least some of the steps of the methods set forth herein. Non-transitory medium used herein refers to all computer-readable media except for transitory, propagating signals. Examples of non-transitory computer-readable medium include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

Those skilled in the art to which this application relates will appreciate that other and further additions, deletions, substitutions and modifications may be made to the described embodiments.

Various aspects of the disclosure can be claimed including the apparatuses, systems, and methods as disclosed herein. Aspects disclosed herein include:

A. A plasma source for excitation of a plasma from one or more gasses and optical monitoring thereof, the plasma source including: (1) a coaxial resonant cavity body having an inner length, and including a first end, a second end, an inner electrode and an outer electrode, (2) a radio frequency signal interface electrically coupled to the inner and outer electrodes at a fixed position along the inner length and configured to provide a radio frequency signal to the coaxial resonant cavity body, (3) a window positioned at the first end of the coaxial resonant cavity body, and (4) a mounting flange positioned proximate the window at the first end of the coaxial resonant cavity body and defining a plasma cavity, wherein the window forms one side of the plasma cavity and isolates the coaxial resonant cavity body from plasma in the plasma cavity.

B. An excitation system for excitation of a plasma, including: (1) a coaxial resonant cavity body having an inner length, and including a first end, a second end, an inner electrode and an outer electrode, (2) a radio frequency signal interface electrically coupled to the inner and outer electrodes at a fixed position along the inner length and configured to provide a radio frequency signal to the coaxial resonant cavity body, and (3) a source controller configured to provide a radio frequency signal to the radio frequency signal interface.

C. An optical monitoring system including: (1) a plasma source configured to ignite, excite and produce optical emission from a plasma within a plasma cavity in gaseous communication with a process chamber, (2) a source controller configured to provide a radio frequency signal to a radio frequency signal interface of the plasma source to generate an electromagnetic field in the plasma cavity for the ignition and excitation of the plasma, (3) an optical coupling system configured to communicate optical signals observed from the excitation of the plasma, and (4) a spectrometer configured to receive and convert the optical signals to electrical signals.

Each of the aspects A, B, and C may have one or more of the following additional elements in combination:

Element 1: wherein the inner length of the coaxial resonant cavity body is nominally an odd number of quarter wavelengths of the provided radio frequency signal. Element 2: wherein the fixed position is at a coupling point distance from the first end along the inner length, and values of the coupling point distance and the inner length cooperate to intensify and localize an electromagnetic field, derived from the provided radio frequency signal, proximate the window. Element 3: wherein the window is of a material selected from sapphire and fused silica with a thickness of three millimeters or less. Element 4: wherein the radio frequency signal interface is inductively electrically coupled to the inner and outer electrodes. Element 5: wherein the radio frequency signal interface is capacitively electrically coupled to the inner and outer electrodes. Element 6: further comprising one or more tuning stubs adjustable within a volume between the outer and inner electrodes. Element 7: wherein the coaxial resonant cavity body, the mounting flange, and the window are removably connected. Element 8: wherein at the first end the inner electrode has a window end with a shape that defines a location of the plasma within the plasma cavity. Element 9: wherein the shape is selected from a cross having symmetric rounded arms, a cross with truncated arms, an asymmetric cross, a single point, and a frustum of a cone. Element 10: wherein the window end of the inner electrode is removable. Element 11: further comprising an isolation screen. Element 12: further comprising an optical signal aperture proximate the window and coinciding with a location of the plasma. Element 13: wherein the location of the optical signal aperture corresponds to a shape of the inner electrode at the first end. Element 14: further comprising an optical fiber access that coincides with the optical signal aperture. Element 15: wherein the optical fiber access extends along a length of the coaxial resonant cavity body between the first and second ends. Element 16: wherein the coaxial resonant cavity body has an impedance that matches an impedance of a source of the radio frequency signal. Element 17: further comprising a magnet supplying a magnetic field that interacts with the plasma within the plasma cavity to assist ignition of the plasma and sustaining of the plasma after the ignition. Element 18: wherein the magnet is connected with the mounting flange. Element 19: wherein the source controller controls a power level, frequency, phase, and duty cycle of the radio frequency signal. Element 20: wherein the source controller automatically controls an amount of power based upon forward and reflected power measured between the source controller and the plasma source. Element 21: wherein the source controller includes a radio frequency synthesizer that defines the frequency of the radio frequency signal, and a variable gain radio frequency signal path that sets an amount of power. Element 22: wherein the source controller automatically controls the frequency of the radio frequency signal based on radio frequency signal gain and phase information measured between the source controller and the plasma source. Element 23: wherein the source controller is remotely located from the coaxial resonant cavity body. Element 24: further comprising a window positioned at the first end of the coaxial resonant cavity body, and a mounting flange positioned proximate the window at the first end of the coaxial resonant cavity body and defining a plasma cavity, wherein the window forms one side of the plasma cavity and isolates the coaxial resonant cavity body from plasma in the plasma cavity. Element 25: wherein the source controller automatically controls an amount of power of the radio frequency signal based upon forward and reflected power measured between the source controller and the plasma source.

The invention claimed is:

1. A plasma source for excitation of a plasma from one or more gasses and monitoring of optical emissions therefrom, the plasma source comprising:
 a coaxial resonant cavity body having an inner length, and including a first end, a second end, an inner electrode and an outer electrode;
 a radio frequency signal interface electrically coupled to the inner and outer electrodes at a fixed position along the inner length and configured to provide a radio frequency signal to the coaxial resonant cavity body;
 a window positioned at the first end of the coaxial resonant cavity body; and
 a mounting flange positioned proximate the window at the first end of the coaxial resonant cavity body and defining a plasma cavity, wherein the window forms one side of the plasma cavity and isolates the coaxial resonant cavity body from plasma in the plasma cavity.

2. The plasma source as recited in claim 1 wherein the inner length of the coaxial resonant cavity body is nominally an odd number of quarter wavelengths of the provided radio frequency signal.

3. The plasma source as recited in claim 2 wherein the fixed position is at a coupling point distance from the first end along the inner length, and values of the coupling point distance and the inner length cooperate to intensify and localize an electromagnetic field, derived from the provided radio frequency signal, proximate the window.

4. The plasma source as recited in claim 1 wherein the window is of a material selected from sapphire and fused silica with a thickness of three millimeters or less.

5. The plasma source as recited in claim 1 wherein the radio frequency signal interface is inductively electrically coupled to the inner and outer electrodes.

6. The plasma source as recited in claim 1 wherein the radio frequency signal interface is capacitively electrically coupled to the inner and outer electrodes.

7. The plasma source as recited in claim 1 further comprising one or more tuning stubs adjustable within a volume between the outer and inner electrodes.

8. The plasma source as recited in claim 1 wherein the coaxial resonant cavity body, the mounting flange, and the window are removably connected.

9. The plasma source as recited in claim 1 wherein at the first end the inner electrode has a window end with a shape that defines a location of the plasma within the plasma cavity.

10. The plasma source as recited in claim 9 wherein the shape is selected from a cross having symmetric rounded arms, a cross with truncated arms, an asymmetric cross, a single point, and a frustum of a cone.

11. The plasma source as recited in claim 9 wherein the window end of the inner electrode is removable.

12. The plasma source as recited in claim 1 further comprising an isolation screen.

13. The plasma source as recited in claim 1 further comprising an optical signal aperture proximate the window and coinciding with a location of the plasma.

14. The plasma source as recited in claim 13 wherein the location of the optical signal aperture corresponds to a shape of the inner electrode at the first end.

15. The plasma source as recited in claim 13 further comprising an optical fiber access that coincides with the optical signal aperture.

16. The plasma source as recited in claim 15 wherein the optical fiber access extends along a length of the coaxial resonant cavity body between the first and second ends.

17. The plasma source as recited in claim 1 wherein the coaxial resonant cavity body has an impedance that matches an impedance of a source of the radio frequency signal.

18. The plasma source as recited in claim 1 further comprising a magnet supplying a magnetic field that interacts with the plasma within the plasma cavity to assist ignition of the plasma and sustaining of the plasma after the ignition.

19. The plasma source as recited in claim 18 wherein the magnet is connected with the mounting flange.

20. An excitation system for excitation of a plasma, comprising:
   a coaxial resonant cavity body having an inner length, and including a first end, a second end, an inner electrode and an outer electrode;
   a radio frequency signal interface electrically coupled to the inner and outer electrodes at a fixed position along the inner length and configured to provide a radio frequency signal to the coaxial resonant cavity body; and;
   a source controller configured to provide a radio frequency signal to the radio frequency signal interface.

21. The excitation system as recited in claim 20 wherein the source controller controls a power level, frequency, phase, and duty cycle of the radio frequency signal.

22. The excitation system as recited in claim 21 wherein the source controller automatically controls an amount of power based upon forward and reflected power measured between the source controller and the plasma source.

23. The excitation system as recited in claim 20 wherein the source controller includes a radio frequency synthesizer that defines the frequency of the radio frequency signal, and a variable gain radio frequency signal path that sets an amount of power.

24. The excitation system as recited in claim 23 wherein the source controller automatically controls the frequency of the radio frequency signal based on radio frequency signal gain and phase information measured between the source controller and the plasma source.

25. The excitation system as recited in claim 20 wherein the source controller is remotely located from the coaxial resonant cavity body.

26. The excitation system as recited in claim 20 further comprising a window positioned at the first end of the coaxial resonant cavity body, and a mounting flange positioned proximate the window at the first end of the coaxial resonant cavity body and defining a plasma cavity, wherein the window forms one side of the plasma cavity and isolates the coaxial resonant cavity body from plasma in the plasma cavity.

* * * * *